US012532554B2

(12) United States Patent
Liu et al.

(10) Patent No.: US 12,532,554 B2
(45) Date of Patent: Jan. 20, 2026

(54) DOPED SEMICONDUCTOR STRUCTURE FOR NIR SENSORS

(71) Applicant: Taiwan Semiconductor Manufacturing Company, Ltd., Hsinchu (TW)

(72) Inventors: Po-Chun Liu, Hsinchu (TW); Eugene I-Chun Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 543 days.

(21) Appl. No.: 17/570,066

(22) Filed: Jan. 6, 2022

(65) Prior Publication Data

US 2023/0027354 A1    Jan. 26, 2023

Related U.S. Application Data

(60) Provisional application No. 63/225,656, filed on Jul. 26, 2021.

(51) Int. Cl.
*H10F 39/00* (2025.01)
*H10F 39/18* (2025.01)
*H10F 77/122* (2025.01)

(52) U.S. Cl.
CPC ....... *H10F 39/011* (2025.01); *H10F 39/1825* (2025.01); *H10F 39/184* (2025.01);
(Continued)

(58) Field of Classification Search
CPC ......... H01L 27/14683; H01L 27/14649; H01L 31/028; H01L 27/14636; H01L 31/103;
(Continued)

(56) References Cited

U.S. PATENT DOCUMENTS

2007/0045682 A1* 3/2007 Hong ...................... H10F 39/80
                                                        257/292
2009/0298260 A1* 12/2009 Zhu ....................... H10F 39/199
                                                        257/E21.568
(Continued)

FOREIGN PATENT DOCUMENTS

CN       108511467 A     9/2018
JP       2003224292 A    8/2003
(Continued)

OTHER PUBLICATIONS

Burrows, Steven P. "Infrared Spectroscopic Measurement of Titanium Dioxide Nanoparticle Shallow Trap State Energies" Virginia Polytechnic Institute and State University, published on Feb. 10, 2010.

*Primary Examiner* — Yara B Green
*Assistant Examiner* — Akhee Sarker-Nag
(74) *Attorney, Agent, or Firm* — Eschweiler & Potashnik, LLC

(57) ABSTRACT

The present disclosure relates a method of forming an integrated chip structure. The method includes etching a base substrate to form a recess defined by one or more interior surfaces of the base substrate. A doped epitaxial layer is formed along the one or more interior surfaces of the
(Continued)

base substrate, and an epitaxial material is formed on horizontally and vertically extending surfaces of the doped epitaxial layer. A first doped photodiode region is formed within the epitaxial material and a second doped photodiode region is formed within the epitaxial material. The first doped photodiode region has a first doping type and the second doped photodiode region has a second doping type.

20 Claims, 21 Drawing Sheets

(52) U.S. Cl.
CPC ....... H10F 39/1847 (2025.01); H10F 77/122 (2025.01); *H10F 39/811* (2025.01)

(58) Field of Classification Search
CPC ............. H01L 31/1808; H01L 31/1812; H01L 27/14603; H01L 27/1463; H01L 27/14643; H01L 31/1804; H01L 31/0203; H01L 31/0288; H10F 39/011; H10F 39/184; H10F 77/122; H10F 39/811; H10F 30/221; H10F 71/1212; H10F 71/1215; H10F 39/802; H10F 39/18; H10F 39/807; H10F 77/1223; H10F 77/50; H10F 71/121; H10F 39/1825; H10F 39/1847

See application file for complete search history.

(56) References Cited

U.S. PATENT DOCUMENTS

| | | | |
|---|---|---|---|
| 2010/0006961 A1 | 1/2010 | Yasaitis et al. | |
| 2013/0256822 A1* | 10/2013 | Chen | H10F 39/026 257/443 |
| 2014/0339398 A1 | 11/2014 | Mazzillo et al. | |
| 2015/0311376 A1 | 10/2015 | Yu | |
| 2018/0247968 A1* | 8/2018 | Na | H10F 30/2218 |
| 2020/0105812 A1* | 4/2020 | Sze | H10F 39/1843 |
| 2021/0091246 A1* | 3/2021 | Chern | H01L 31/035254 |
| 2021/0098524 A1* | 4/2021 | Liu | H10F 39/184 |
| 2021/0375959 A1* | 12/2021 | Hung | H10F 39/80 |
| 2022/0328556 A1 | 10/2022 | Liu et al. | |
| 2024/0063238 A1* | 2/2024 | Maruyama | H04N 25/10 |

FOREIGN PATENT DOCUMENTS

| | | |
|---|---|---|
| JP | 4105440 B | 6/2008 |
| WO | 2018187370 A1 | 10/2018 |

* cited by examiner

DOPED SEMICONDUCTOR STRUCTURE FOR NIR SENSORS

REFERENCE TO RELATED APPLICATION

This Application claims the benefit of U.S. Provisional Application No. 63/225,656, filed on Jul. 26, 2021, the contents of which are hereby incorporated by reference in their entirety.

BACKGROUND

Image sensors are solid-state devices that are configured to convert incoming light (e.g., photons) into an electrical signal. The electrical signal is then provided to a processor that can convert the electrical signal to data that can be stored and/or viewed by a user. Integrated chips (ICs) with image sensors are used in a wide range of modern day electronic devices, such as cell phones, security cameras, medical devices, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
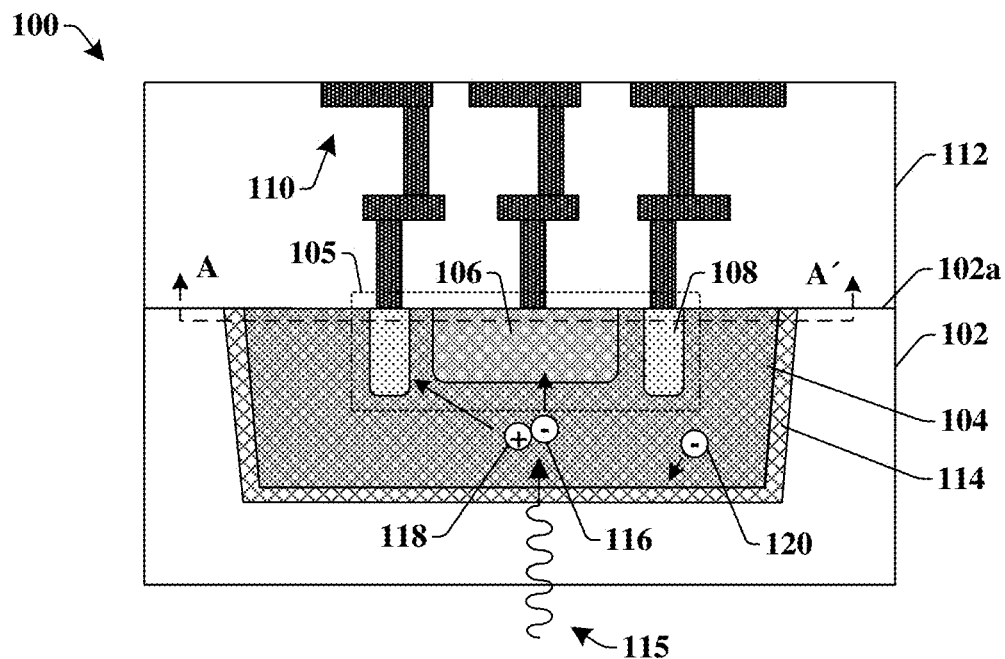
FIGS. 1A-1B illustrate some embodiments of an image sensing structure comprising a doped epitaxial layer disposed along exterior surfaces of an epitaxial material comprising a photodetector.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, image sensor integrated chips (ICs) with capabilities to detect near-infrared radiation (NIR) (e.g., radiation having a wavelength between approximately 900 nm and approximately 2,500 nm) have becoming increasingly common. One reason for this is that image sensor ICs that are able to detect NIR are able to operate effectively with little to no visible light, thereby making such image sensor ICs ideal for machine and/and night vision cameras. Additionally, because the night sky contains more NIR photons than visible photons, the ability of an image sensor IC to detect NIR radiation allows for good image capture without the use of extra illumination (e.g., LEDs), thereby decreasing power consumption and increasing battery life associated with the image sensor IC.

Image sensor ICs typically comprise an image sensing element (e.g., a photodetector) disposed within a silicon substrate. However, the absorption coefficient of silicon decreases as a wavelength of radiation increases. Therefore, image sensor ICs are normally able to detect NIR radiation with a relatively low quantum efficiency (e.g., a ratio of the number of photons that contribute to an electric signal generated by an image sensing element within a pixel region to the number of photons incident on the pixel region).

Germanium based photodiodes may present a better option for NIR photodetectors. This is because germanium is a direct band gap material and thus is able to operate in the NIR spectrum with a higher efficiency than silicon. Germanium based photodiodes can be fabricated by forming a photodetector (e.g., a photodiode) within a germanium based material formed within a recess in a silicon base substrate. However, it has been appreciated that during fabrication of such a photodiode, defects (e.g., dislocation defects) may formed along an interface between the silicon and the germanium based material. The defects can induce a dark current leakage within the photodetector (e.g., through the thermal generation of free charge carriers), thereby reducing performance of NIR sensing (e.g., limiting the application of NIR for 3D sensing).

The present disclosure, in some embodiments, relates to an integrated chip structure having a photodetector disposed within an epitaxial material (e.g., a germanium based epitaxial material) within a base substrate (e.g., a silicon base substrate). The integrated chip structure comprises a doped epitaxial layer disposed along an interface between the epitaxial material and the base substrate. The doped epitaxial layer has dopants that are configured to passivate defects along the interface, thereby reducing the formation (e.g., the thermal generation) of free charge carriers that lead to the formation of dark current. By reducing the formation of dark current, performance of the integrated chip structure can be improved. Furthermore, by utilizing a doped epitaxial layer (e.g., rather than an implantation process) to introduce dopants in the integrated chip structure, an area of the dopants can be well controlled thereby limiting negative effects of the dopants on the photodetector.

FIG. 1A illustrates a cross-sectional view of some embodiments of an integrated chip structure 100 comprising a doped epitaxial layer disposed along an interface between a base substrate and an epitaxial material comprising a photodetector.

The integrated chip structure 100 comprises a base substrate 102. The base substrate 102 has one or more interior surfaces defining a recess that extends into a first surface 102a of the base substrate 102. An epitaxial material 104 is disposed within the recess. In some embodiments, the epitaxial material 104 has an upper surface that extends between outermost sidewalls contacting the base substrate 102. In some embodiments, the base substrate 102 may comprise silicon. In some embodiments, the epitaxial material 104 may comprise a direct band gap material. In some additional embodiments, the epitaxial material 104 may comprise a germanium based material, such as germanium, silicon germanium, or the like.

Figure 1B:
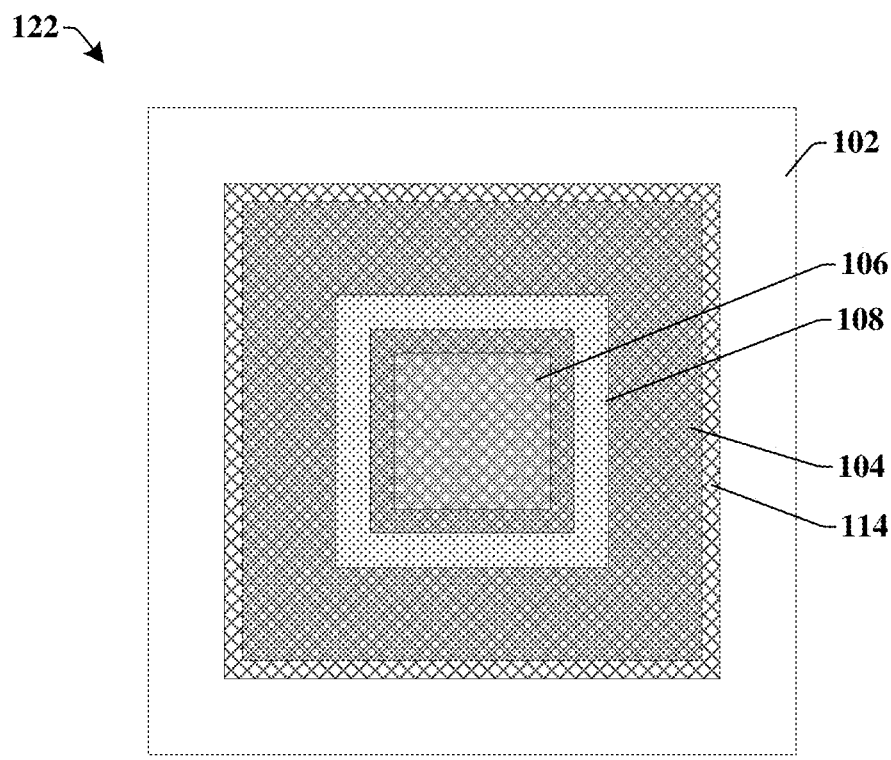

A photodetector 105 is disposed within the epitaxial material 104. In some embodiments, the photodetector 105 may comprise a photodiode. In some such embodiments, the photodetector 105 comprises a first doped photodiode region 106 and a second doped photodiode region 108 laterally surrounding the first doped photodiode region 106. The first doped photodiode region 106 may comprise a first doping type (e.g., n-type doping) and the second doped photodiode region 108 may comprise a second doping type (e.g., a p-type doping). In some embodiments, shown in a top-view 122 of FIG. 1B, the second doped photodiode region 108 may wrap around the first doped photodiode region 106. In some additional embodiments, the second doped photodiode region 108 may wrap around the first doped photodiode region 106 in a continuous and unbroken loop.

During operation, an incident photon 115 that strikes the epitaxial material 104 causes an electron-hole pair, comprising an electron 116 and a hole 118, to be generated. Bias voltages may be applied to the first doped photodiode region 106 and the second doped photodiode region 108 to form an electric field within the epitaxial material 104. The electric field may cause the electron 116 and the hole 118 to generate a photocurrent by moving towards the first doped photodiode region 106 and second doped photodiode region 108. In embodiments where the epitaxial material 104 comprises a direct band gap material, the photodetector 105 is able to provide for good performance in detecting near infrared radiation (e.g., radiation having a wavelength that is in a range of between approximately 1310 nm and approximately 1550 nm).

A doped epitaxial layer 114 is arranged along horizontally and vertically extending interfaces between the base substrate 102 and the epitaxial material 104. In some embodiments, the doped epitaxial layer 114 comprises the second doping type (e.g., a p-type doping). The doped epitaxial layer 114 has a maximum dopant concentration that is greater than the epitaxial material. The doped epitaxial layer 114 is configured to passivate defects along the interface between the base substrate 102 and the epitaxial material 104, so as to mitigate the generation (e.g., the thermal generation) of free charge carriers 120 (e.g., free electrons that form within the epitaxial material 104) that can contribute to a flow of dark current within the photodetector 105.

The doped epitaxial layer 114 may be formed by way of a deposition process (e.g., by way of an in-situ doped epitaxial growth process) to have a relatively small thickness (e.g., a thickness of between approximately 10 nm and approximately 1000 nm, a thickness of between approximately 10 nm and approximately 500 nm, or other suitable values). Furthermore, a transition from a first doping concentration of the doped epitaxial layer 114 to a second doping concentration of the epitaxial material 104 occurs over a relatively small distance. For example, the transition from a first doping concentration of 1e17 atoms/cm$^3$ within the doped epitaxial layer 114 to a second doping concentration of approximately 1e16 atoms/cm$^3$ within the epitaxial material 104 may occur over a distance that is between approximately 10% and approximately 20% of a distance that is able to be achieved through an implantation process (e.g., the transition may occur over a distance of 1000 Angstroms compared to a distance of 7000 Angstroms achieved through an implantation process). By having the doped epitaxial layer 114 have a relatively small thickness, a size of the doped epitaxial layer 114 is relatively small and a size of the epitaxial material 104 is relatively large. The relatively large size of the epitaxial material 104 allows for electron-hole pairs to be formed over a relatively large area, thereby improving an efficiency of the photodetector 105. Furthermore, forming the doped epitaxial layer 114 by way of a deposition process avoids implantation damage that can lead to further defects, thereby further mitigating leakage currents in the photodetector 105. Overall the disclosed doped epitaxial layer 114 may reduce dark current in the epitaxial material 104 by up to approximately 70% (e.g., from approximately 130 pico-amperes (pA) to approximately 44 pA), by approximately 50%, by approximately 25%, or other similar values.

Figure 2A:
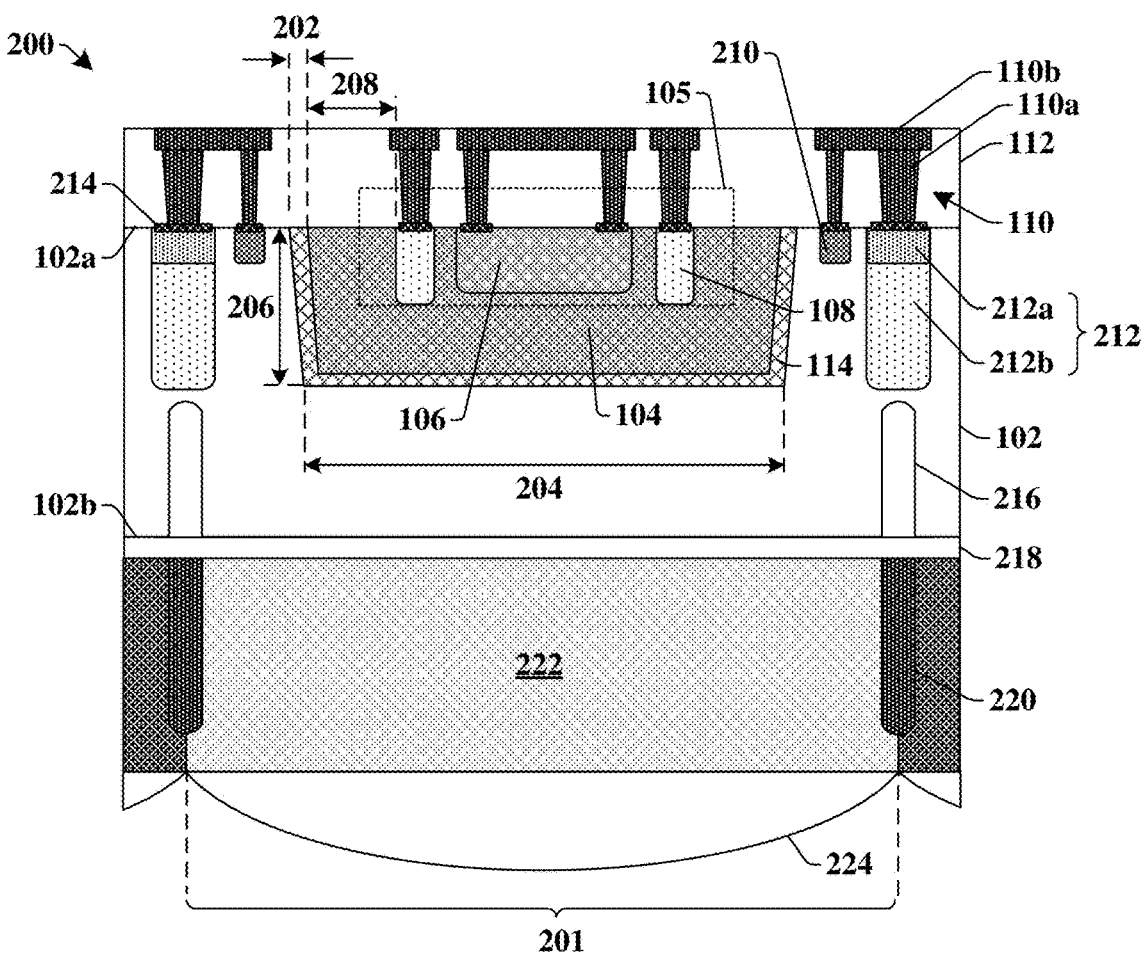
FIGS. 2A-2B illustrate some additional embodiments of an image sensing structure comprising a doped epitaxial layer disposed along exterior surfaces of an epitaxial material comprising a photodetector.
Figure 2B:
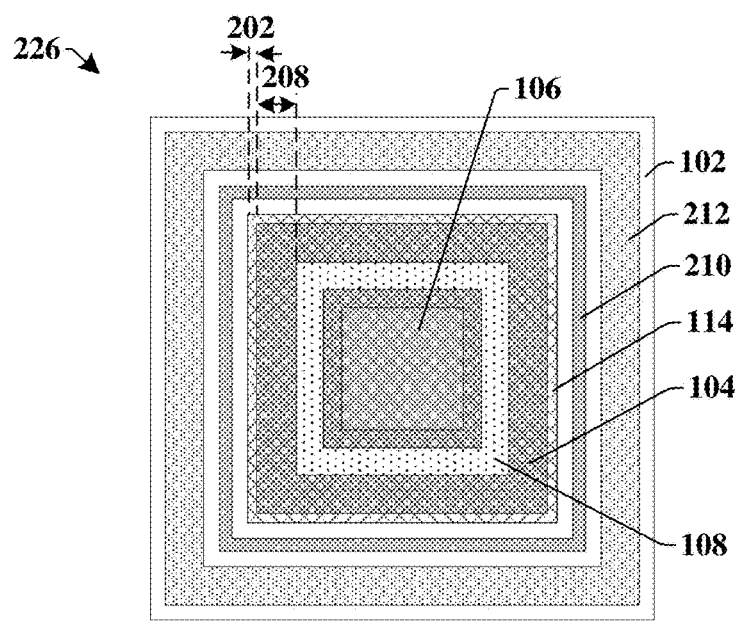

FIGS. 2A-2B illustrate some additional embodiments of an image sensing structure comprising a disclosed doped epitaxial layer.

As shown in the cross-sectional view 200 of FIG. 2A, the image sensing structure comprises an epitaxial material 104 disposed within a pixel region 201 of a base substrate 102. A photodetector 105 is disposed within the epitaxial material 104. The photodetector 105 comprises a first doped photodiode region 106 and a second doped photodiode region 108. As shown in top-view 226 of FIG. 2B, in some embodiments, the first doped photodiode region 106 may have a substantially square shape. In other embodiments (not shown), the first doped photodiode region 106 may have a circular shape, a rectangular shape, a polygonal shape, or the like. In some embodiments, the second doped photodiode region 108 wraps around the first doped photodiode region 106 in a square shaped ring, a circular shaped ring, or the like.

A doped epitaxial layer 114 is arranged along horizontally and vertically extending interfaces between the epitaxial material 104 and the base substrate 102. In various embodiments, the doped epitaxial layer 114 may comprise a same material as the base substrate 102 or a same material as the epitaxial material 104. The doped epitaxial layer 114 may comprise a dopant species having a doping concentration of between approximately 5e17 atoms/cm$^3$ and approximately 1e20 atoms/cm$^3$. In some embodiments, the dopant species is boron. In other embodiments, the dopant species may be aluminum, gallium, or the like. The doping concentration profile of the doped epitaxial layer 114 abruptly changes over a relatively small distance, thereby allowing the doped epitaxial layer 114 to achieve a high doping concentration (e.g., greater than approximately 5e17) while maintaining a relatively small width. For example, the doping concentration profile may change by a range of between approximately 50% to approximately 60% (e.g., from approximately 1e16 atoms/cm$^3$ to approximately 5e17 atoms/cm$^3$) over a distance of less than or equal to approximately 100 nm. The high doping concentration enables the doped epitaxial layer 114 to effectively mitigate dark current.

In some embodiments, the doped epitaxial layer 114 has a first width 202 that is relatively small compared to a second width 204 of the epitaxial material 104. The first width 202 of the doped epitaxial layer 114 leaves a relatively large volume of the epitaxial material 104 in which electron-hole pairs may be formed, thereby improving an efficiency of the photodetector 105. In some embodiments, the first width 202 is in a range of between approximately 0.1% and approximately 7.5% of the second width 204, between approximately 1% and approximately 5% of the second width 204, or other similar values. In some embodiments, the doped epitaxial layer 114 has a height directly below the epitaxial material, which is in a range of between approximately 0.3% and approximately 15% of a first height 206 of the epitaxial material 104, between approximately 1% and approximately 10% of the first height 206, or other similar values.

In some embodiments, the first height 206 of the epitaxial material 104 may be in a range of between approximately 1 micron and approximately 3 microns, between approximately 1 micron and approximately 2 microns, or other similar values. In some embodiments, the first width 202 of the doped epitaxial layer 114 may be in a range of between approximately 100 Angstroms (Å) and approximately 10000 Å, between approximately 100 Angstroms (Å) and approximately 5000 Å, between approximately 100 Å and approximately 1500 Å, between approximately 100 Å and approximately 1000 Å, between approximately 250 Å and approximately 750 A, or other similar values. In some embodiments, the first width 202 (e.g., thickness) of the doped epitaxial layer 114 may be substantially uniform along sidewalls and a horizontally extending surface of the epitaxial material 104. In some embodiments, the second width 204 of the epitaxial material 104 may be in a range of between approximately 2 microns and approximately 10 microns, between approximately 3 microns and approximately 5 microns, or other similar values.

In some embodiments, the doped epitaxial layer 114 may be laterally separated from the first doped photodiode region 106 by a distance 208 that is in a range of between approximately 10% and approximately 25% of the second width 204 of the epitaxial material 104. In some embodiments, the distance 208 may be in a range of between approximately 500 nanometers (nm) and approximately 2.5 microns, between approximately 750 nm and approximately 2 microns, or other similar values.

A first doped isolation region 210 is arranged along a first surface 102a of the base substrate 102 and a second doped isolation region 212 is disposed along the first surface 102a of the base substrate 102. In some embodiments, the first doped isolation region 210 is laterally between the epitaxial material 104 and the second doped isolation region 212. In some embodiments, the second doped isolation region 212 may comprise a first part 212a and a second part 212b disposed below the first part 212a. In some embodiments, the first part 212a may have a higher doping concentration than the second part 212b, so as to provide for a lower contact resistance for overlying contacts. In some embodiments, shown in top-view 226 of FIG. 2B, the first doped isolation region 210 may wrap around the second photodiode region 108 as a first closed ring and the second doped isolation region 212 may wrap around the first doped isolation region 210 as a second closed ring.

A silicide 214 is disposed on one or more of the first doped photodiode region 106, the second doped photodiode region 108, the first doped isolation region 210, and the second doped isolation region 212. In some embodiments, the silicide 214 may comprise a nickel silicide, for example. One or more interconnects 110 are disposed within a dielectric structure 112 over the base substrate 102. The one or more interconnects 110 are coupled to the silicide 214. The one or more interconnects 110 may be configured to provide bias voltages to one or more of the first doped photodiode region 106, the second doped photodiode region 108, the first doped isolation region 210, and the second doped isolation region 212. In some embodiments, the one or more interconnects 110 are configured to provide bias voltages to the first doped isolation region 210 and the second doped isolation region 212 to form a depletion region that provides junction isolation between the photodetector 105 and a neighboring photodetector (not shown).

One or more isolation structures 216 are disposed within a second surface 102b of the base substrate 102 opposing the first surface 102a. In some embodiments, the one or more isolation structures 216 may respectively comprise a dielectric material disposed within one or more trenches defined by sidewalls of the base substrate 102. In some embodiments, a dielectric planarization structure 218 may be disposed along the second surface 102b of the base substrate 102. In some embodiments, the dielectric planarization structure 218 may comprise one or more of an oxide, a nitride, a high-k dielectric material, or the like.

In some embodiments, a grid structure 220 is disposed on the dielectric planarization structure 218. In some embodiments, the grid structure 220 may be arranged directly over the one or more isolation structures 216. In some embodiments, the grid structure 220 may extend around a pixel region 201 along a closed path. In some embodiments, the grid structure 220 may comprise a metal, such as aluminum, cobalt, copper, silver, gold, tungsten, etc. In some embodiments, a filter 222 is arranged between sidewalls of the grid structure 220. The filter 222 is configured to transmit specific wavelengths of incident radiation (e.g., wavelengths in the infrared and/or near infrared region of the electromagnetic spectrum). In some embodiments, the filter 222 may comprise silicon. A micro-lens 224 may be arranged on the filter 222. The micro-lens 224 is configured to focus the incident radiation (e.g., light) towards the photodetector 105.

Figure 3:
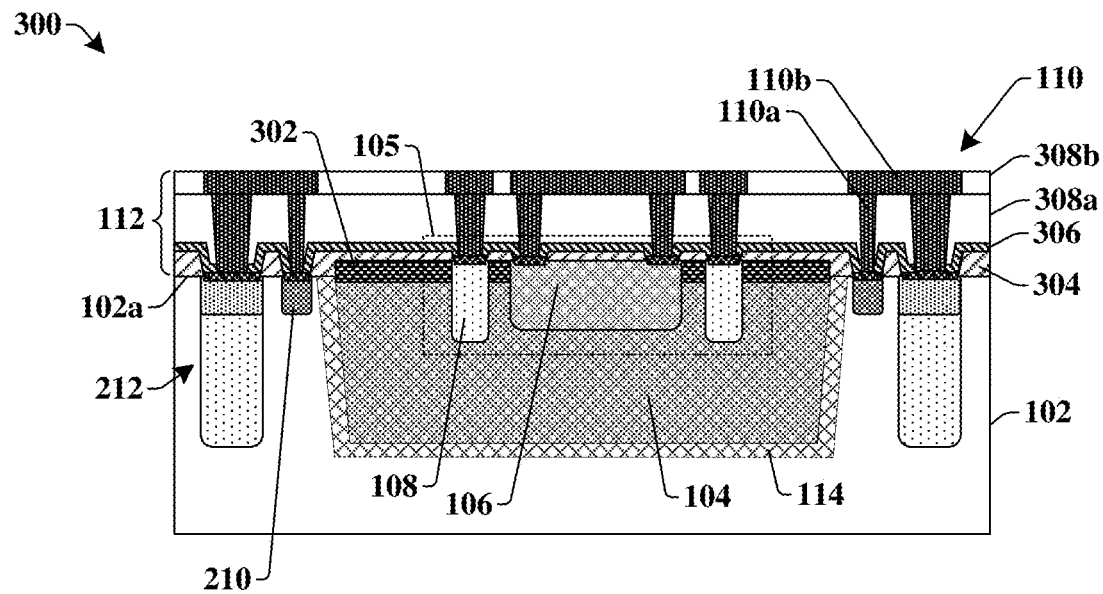
FIGS. 3-4 illustrate cross-sectional views of some additional embodiments of an image sensing structure comprising a disclosed doped epitaxial layer.

FIG. 3 illustrates a cross-sectional view of some additional embodiments of an image sensing structure 300 comprising a disclosed doped epitaxial layer.

The image sensing structure 300 comprises a cap layer 302 disposed over an epitaxial material 104 within a base substrate 102. In some embodiments, the cap layer 302 may comprise a semiconductor material such as silicon. A first doped photodiode region 106 and a second doped photodiode region 108 extend from within the cap layer 302 to within the epitaxial material 104. In some embodiment, the cap layer 302 may have an outermost sidewall that is aligned with an outermost sidewall of the epitaxial material 104. In such embodiments, the cap layer 302 and the epitaxial material 104 may have substantially equal widths along a top surface (e.g. a first surface 102a) of the base substrate 102. A doped epitaxial layer 114 extends along an interface between the base substrate 102 and the epitaxial material 104. In some embodiments, the doped epitaxial layer 114 may have an uppermost surface that is laterally outside of the cap layer 302.

A dielectric structure 112 is disposed over the cap layer 302 and the upper surface of the base substrate 102. In some embodiments, the dielectric structure 112 comprises a first dielectric material 304 disposed over the base substrate 102. The first dielectric material 304 laterally extends from directly over the cap layer 302 to directly over a first surface 102a of the base substrate 102. The first dielectric material 304 has one or more sidewalls that form openings over tops of a first doped photodiode region 106, the second doped photodiode region 108, the first doped isolation region 210, and the second doped isolation region 212.

In some additional embodiments, the dielectric structure 112 further comprises a contact etch stop layer (CESL) 306 disposed over the first dielectric material 304 and along the one or more sidewalls of the first dielectric material 304. In various embodiments, the CESL 306 may comprise a nitride, a carbide, or the like. In yet additional embodiments, the dielectric structure 112 comprises one or more inter-level dielectric (ILD) layers 308a-308b stacked onto one another. In some embodiments, the one or more ILD layers 308a-308b may comprise a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

The dielectric structure 112 laterally surrounds one or more interconnects 110 that are coupled to the photodetector 105 and/or one or more doped isolation regions, 210 and 212. In some embodiments, the one or more interconnects 110 may comprise conductive contacts 110a, interconnect vias, and/or interconnect wires 110b. In various embodiments, the one or more interconnects may comprise tungsten, aluminum, copper, ruthenium, and/or the like.

Figure 4:
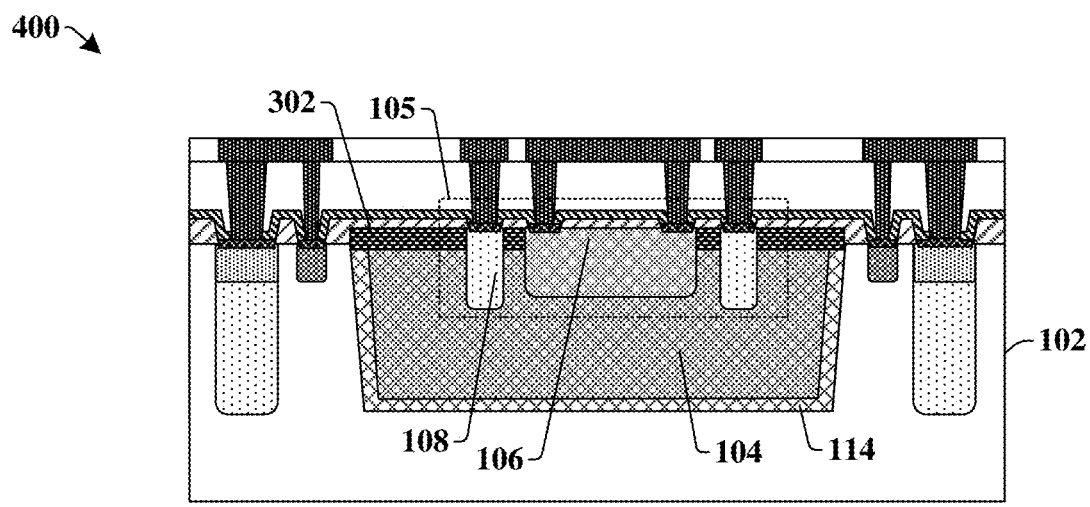

FIG. 4 illustrates a cross-sectional view of some additional embodiments of an image sensing structure 400 comprising a disclosed doped epitaxial layer.

The image sensing structure 400 comprises a cap layer 302 disposed over an epitaxial material 104 within a base substrate 102. A first doped photodiode region 106 and a second doped photodiode region 108 extend from within the epitaxial material 104 to within the cap layer 302. A doped epitaxial layer 114 extends along an interface between the base substrate 102 and the epitaxial material 104. In some embodiments, the doped epitaxial layer 114 may have an uppermost surface that is directly below the cap layer 302. In some additional embodiments, the uppermost surface of the doped epitaxial layer 114 may be completely covered by the cap layer 302.

Figure 5A:
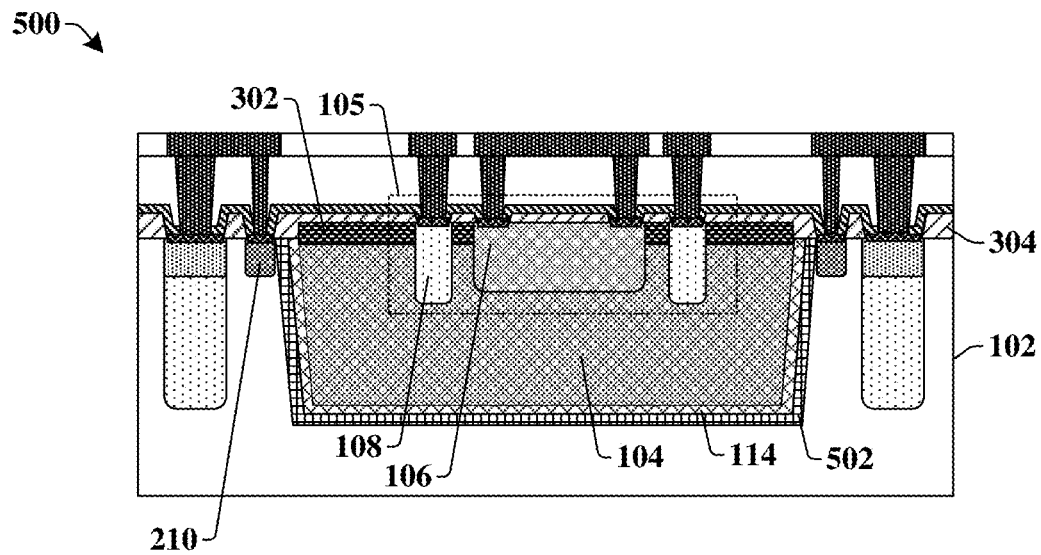
FIGS. 5A-5B illustrate cross-sectional views of some additional embodiments of image sensing structures comprising a disclosed doped epitaxial layer.

FIG. 5A illustrates a cross-sectional view of some additional embodiments of an image sensing structure 500 comprising a disclosed doped epitaxial layer.

The image sensing structure 500 comprises an epitaxial material 104 disposed within a recess within a base substrate 102. A doped epitaxial layer 114 extends along an interface between the base substrate 102 and the epitaxial material 104. In some embodiments, an additional doped region 502 may be disposed within the base substrate 102 along outer edges of the doped epitaxial layer 114. The additional doped region 502 may be formed by an implantation process to mitigate damage that may occur during formation of the recess within the base substrate 102. The implantation process implants dopants into the base substrate 102 after formation of the recess. In comparison with the doped epitaxial layer 114, the additional doped region 502 may have a longer decreasing dopant concentration at an interface toward the base substrate 102. In some embodiments, the additional doped region 502 may laterally and vertically contact the doped epitaxial layer 114. In other embodiments (not shown), the additional doped region 502 may be laterally and vertically separated from the doped epitaxial layer 114 by an non-zero distance.

In some embodiments, both the doped epitaxial layer 114 and the additional doped region 502 may comprise or be a same material as the base substrate 102. For example, the doped epitaxial layer 114 and the additional doped region 502 may comprise or be silicon. In other embodiments, the doped epitaxial layer 114 may comprise a first material (e.g., germanium) and the additional doped region 502 may comprise a second material (e.g., silicon).

In some embodiments, the additional doped region 502 may have a first dopant concentration and the doped epitaxial layer 114 may have a second doped concentration that is different than (e.g., higher than) the additional doped region 502. For example, in some embodiments, the doped epitaxial layer 114 may have a dopant concentration (e.g., a boron concentration) of between approximately 5e17 atoms/$cm^3$ and approximately 1e20 atoms/$cm^3$ while the additional doped region 502 may have a dopant concentration (e.g., a boron concentration) of between approximately 5e16 atoms/$cm^3$ and approximately 1e19 atoms/$cm^3$. In some embodiments the doped epitaxial layer 114 may have a first dopant species (e.g., boron) and the additional doped region 502 may have a second dopant species (e.g., gallium) that is different than the first dopant species. In other embodiments, the doped epitaxial layer 114 and the additional doped region 502 may have a same dopant species (e.g., boron).

Figure 5B:
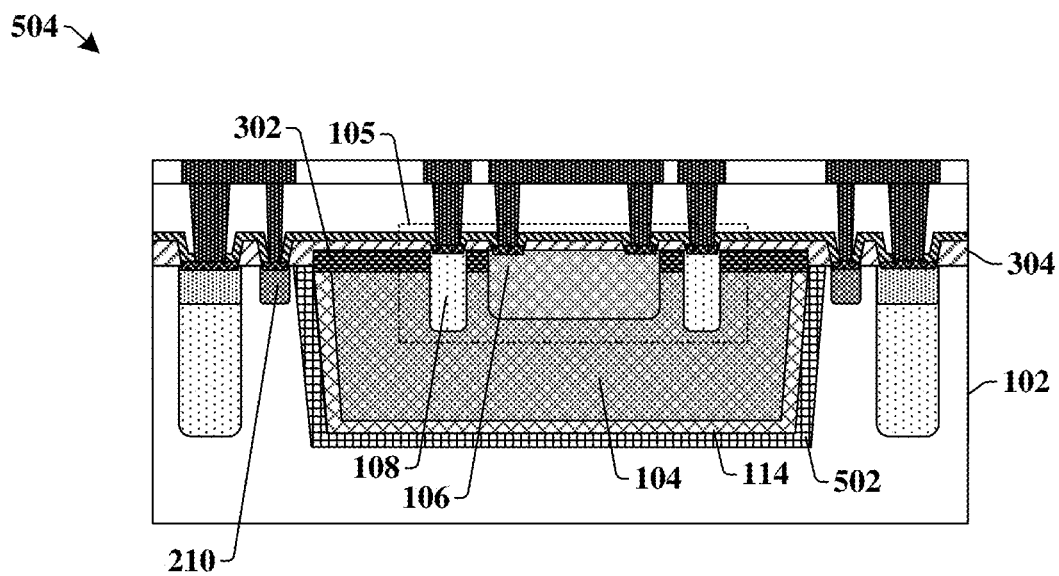

In some embodiments, the doped epitaxial layer 114 may have an uppermost surface and the additional doped region 502 may have an uppermost boundary that are both arranged laterally between a cap layer 302 and a first doped isolation region 210. In such embodiments, the uppermost surface of the doped epitaxial layer 114 and the uppermost boundary of the additional doped region 502 are laterally outside of the cap layer 302. In other embodiments, shown in cross-sectional view 504 of FIG. 5B, the doped epitaxial layer 114 may have an uppermost surface that is directly below the cap layer 302 and the additional doped region 502 may have an uppermost boundary that is laterally outside of the cap layer 302. In some such embodiments, the uppermost surface of the doped epitaxial layer 114 may be vertically offset from (e.g., above or below) the uppermost boundary of the additional doped region 502.

Figure 6A:
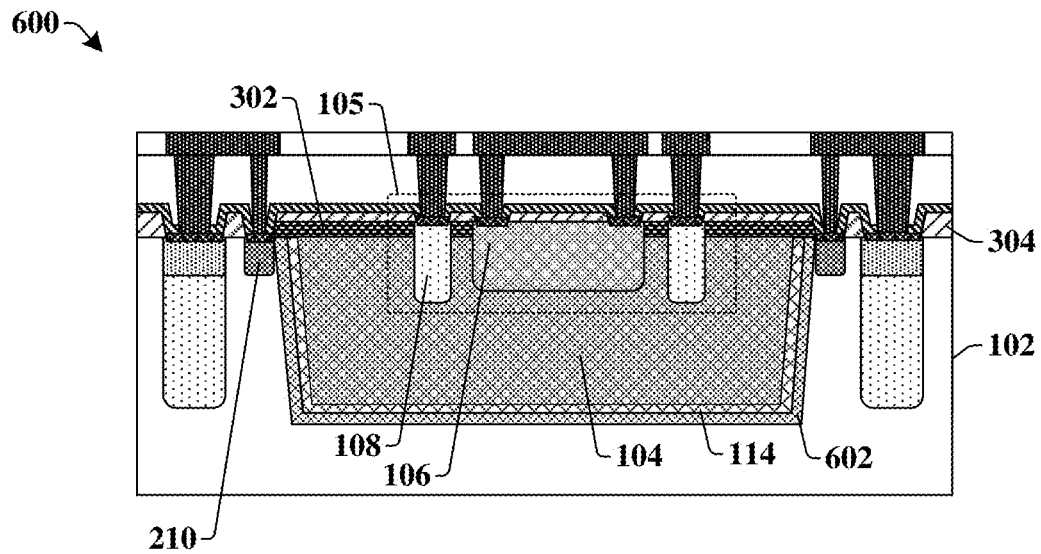
FIGS. 6A-6B illustrate cross-sectional views of some additional embodiments of image sensing structures comprising multiple doped epitaxial layers.

FIG. 6A illustrates a cross-sectional view of some embodiments of an image sensing structure 600 comprising multiple doped epitaxial layers disposed along exterior surfaces of an epitaxial material comprising a photodetector.

The image sensing structure 600 comprises an epitaxial material 104 disposed within a recess in a base substrate 102. A doped epitaxial layer 114 extends along outer edges of the epitaxial material 104. An additional doped epitaxial layer 602 extends along outer edges of the doped epitaxial layer 114. The doped epitaxial layer 114 both laterally and vertically separates the epitaxial material 104 from the additional doped epitaxial layer 602, and the additional doped epitaxial layer 602 both laterally and vertically separates the base substrate 102 from the doped epitaxial layer 114. In some embodiments, a cap layer 302 may be disposed over topmost surface of both the doped epitaxial layer 114 and the additional doped epitaxial layer 602. In some embodiments, the additional doped epitaxial layer 602 and the doped epitaxial layer 114 are doped during epitaxy processes. A dopant concentration profile of a layer, which is doped during an epitaxy process, is different from a dopant concentration profile of a layer, which is implanted after an epitaxy process.

In some embodiments, the doped epitaxial layer 114 may comprise a first material and the additional doped region 602 may comprise a second material that is different than the first material. For example, in some embodiments, the doped epitaxial layer 114 may comprise a germanium based material and the additional doped epitaxial layer 602 may comprise or be silicon. In some embodiments, both the doped epitaxial layer 114 and the additional doped epitaxial layer 602 may comprise a same dopant species (e.g., boron). In other embodiments, the doped epitaxial layer 114 may comprise a different dopant species than the additional doped epitaxial layer 602. In some embodiments, both the doped epitaxial layer 114 and the additional doped epitaxial layer 602 may have a dopant concentration that is greater than or equal to approximately 1e18 atoms/cm$^3$. In various embodiments, the doped epitaxial layer 114 and/or the additional doped epitaxial layer 602 may have a constant doping concentration profile, a gradient doping concentration profile, or a stepped doping concentration profile.

Figure 6B:
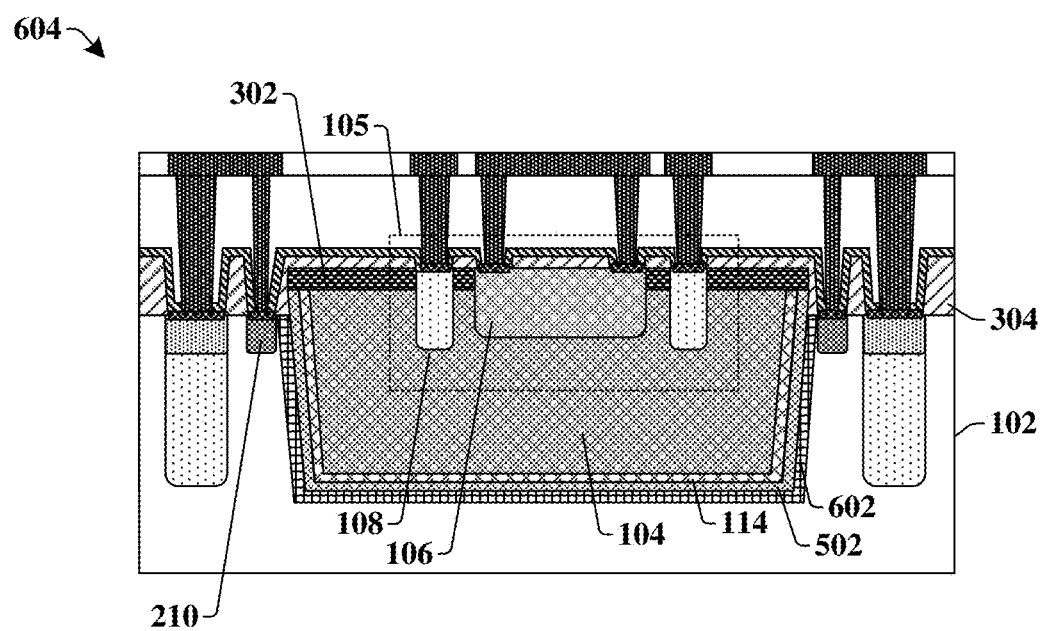

FIG. 6B illustrates a cross-sectional view of some additional embodiments of an image sensing structure 604 comprising multiple doped epitaxial layers.

The image sensing structure 604 comprises a doped epitaxial layer 114 extending along outer edges of an epitaxial material 104 disposed within a recess in a base substrate 102. An additional doped epitaxial layer 602 extends along outer edges of the doped epitaxial layer 114 and an additional doped region 502 extends along outer edges of the additional doped epitaxial layer 602. The doped epitaxial layer 114 both laterally and vertically separates the epitaxial material 104 from the additional doped epitaxial layer 602, and the additional doped epitaxial layer 602 both laterally and vertically separates the doped epitaxial layer 114 from the additional doped region 502.

In some embodiments, the doped epitaxial layer 114 and the additional doped epitaxial layer 602 may extend above a top of the additional doped region 502 and/or a top of the base substrate 102. In some such embodiments, a first dielectric material 304 may extend along sidewalls and to above the uppermost surface of the additional doped epitaxial layer 602. In some embodiments, a cap layer 302 covers uppermost surfaces of the doped epitaxial layer 114 and the additional doped epitaxial layer 602.

Figure 7A:
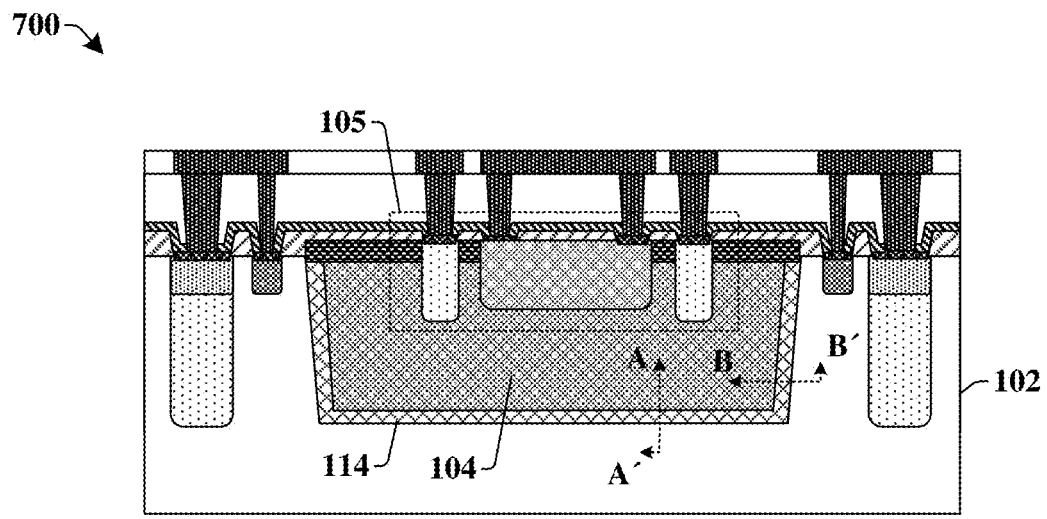
FIG. 7A illustrates a cross-sectional view of some embodiments of an image sensing structure comprising a disclosed doped epitaxial layer.

FIG. 7A illustrates a cross-sectional view of some embodiments of an image sensing structure 700 comprising a doped epitaxial layer.

The image sensing structure 700 comprises a doped epitaxial layer 114 comprising a germanium based material disposed along an interface between a base substrate 102 and an epitaxial material 104. A dopant concentration profile changes along cross-sectional lines A-A' and B-B', which respectively extend through the base substrate 102, the doped epitaxial layer 114, and the epitaxial material 104. In some embodiments, the dopant concentration profile along cross-sectional lines A-A' and B-B' may be substantially the same. It will be appreciated that the doped epitaxial layer 114 disclosed herein may have various dopant concentration profiles. For example, FIGS. 7B-7D illustrate some embodiments of graphs showing a dopant concentration along cross-sectional lines A-A' and B-B' of FIG. 7A.

Figure 7B:
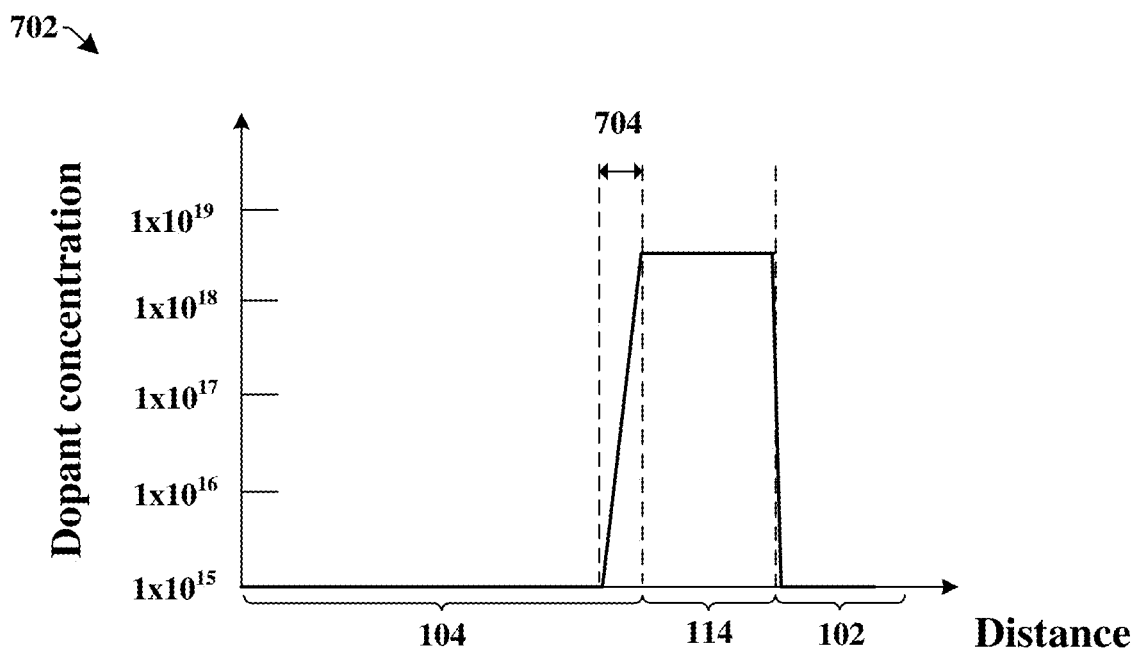
FIGS. 7B-7D illustrate graphs showing various embodiments of dopant concentration profiles along a cross-sectional line of the image sensing structure of FIG. 7A.

As shown in graph 702 of FIG. 7B, in some embodiments the dopant concentration profile has a first value that is substantially constant through a majority of the epitaxial material 104. The dopant concentration profile rapidly increases over a first distance 704 along an edge of the epitaxial material 104 to a second value that is greater than the first value. In some embodiments, the first distance 704 may be controlled in a range of between approximately 5 Å and approximately 100 Å by the formation of the doped epitaxial layer 114. Within the doped epitaxial layer 114 the dopant concentration profile is substantially constant at the second value. Within the base substrate 102 the dopant concentration profile decreases to a third value that is less than the second value. In some embodiments, the first value may be less than or equal to approximately 1e16 atoms/cm$^3$, such as 1e15 atoms/cm$^3$, the second value may be in a range of between of between approximately 1e17 atoms/cm$^3$ and approximately 1e19 atoms/cm$^3$, or between approximately 1e18 atoms/cm$^3$ and approximately 1e19 atoms/cm$^3$, and the third value may be less than or equal to approximately 1e16 atoms/cm$^3$, such as 1e15 atoms/cm$^3$. In other embodiments, the first value, the second value, and the third value may have different values. In some embodiments, the first distance 704 may be a transition zone due to the dopant concentration difference between the doped epitaxial layer 114 and the epitaxial material 104. Since the doped epitaxial layer 114 is doped during its epitaxy process, the transition zone adjacent to the doped epitaxial layer 114 may be narrower (5 Å to 100 Å) than a transition zone adjacent to an implanted layer, along the cross-sectional lines A-A' and B-B'. For example, if boron dopants are implanted at the interface between the epitaxial material 104 and the base substrate 102 to form an implanted layer having 2e17 atoms/cm$^3$, the transition zone of the epitaxial material 104 has a width of 7000 Å, from the interface between the epitaxial material 104 and the doped epitaxial layer 114 to a point of the epitaxial material 104 having a boron concentration of 1e16 atoms/cm$^3$.

Figure 7C:
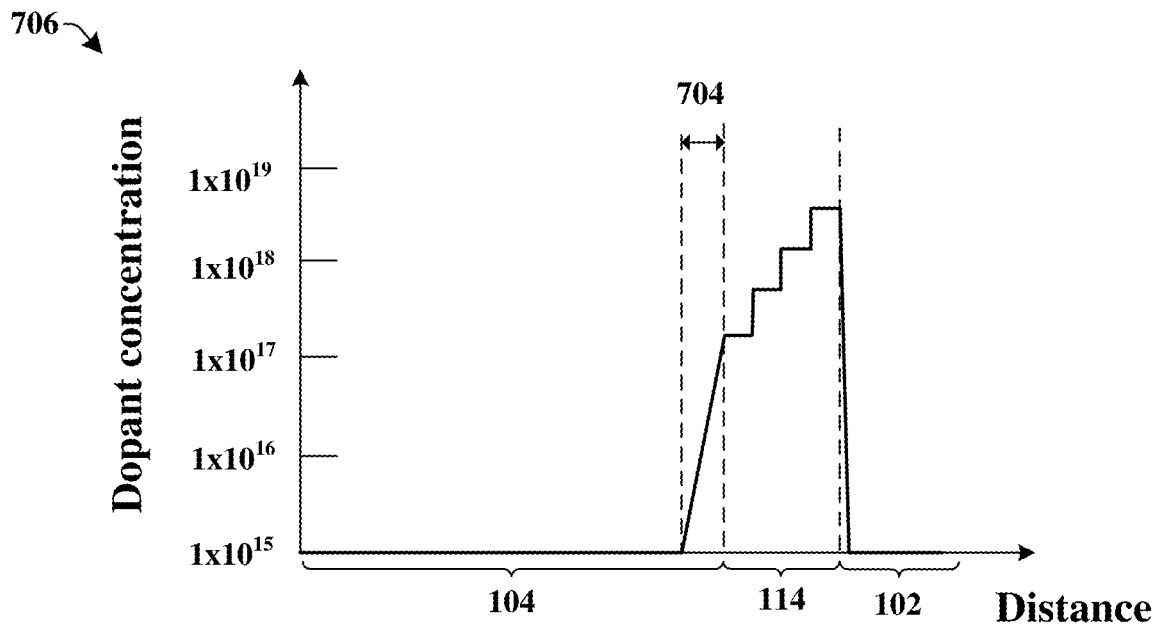

As shown in graph 706 of FIG. 7C, in some embodiments the dopant concentration profile within the doped epitaxial layer 114 has a stepped profile that increases in steps between a plurality of different values.

Figure 7D:
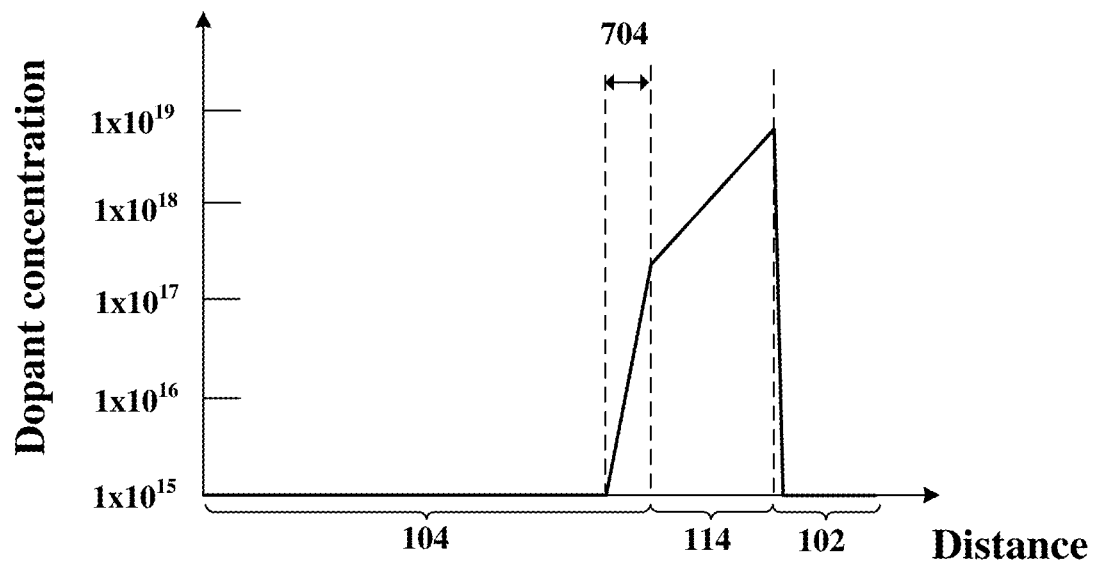

As shown in graph 708 of FIG. 7D, in some embodiments the dopant concentration profile within the doped epitaxial layer 114 has a gradient profile that increases gradually between a second value and a fourth value.

Figure 8A:
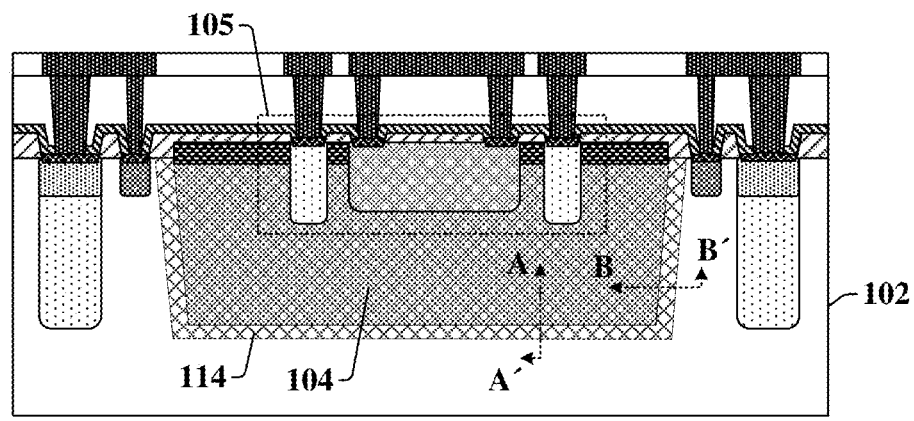
FIG. 8A illustrates a cross-sectional view of some embodiments of an image sensing structure comprising a disclosed doped epitaxial layer.

FIG. 8A illustrates a cross-sectional view of some embodiments of an image sensing structure 800 comprising a doped epitaxial layer.

The image sensing structure 800 comprises a doped epitaxial layer 114 comprising silicon and being arranged along an interface between a base substrate 102 and an epitaxial material 104. A dopant concentration profile changes along cross-sectional lines A-A' and B-B', which respectively extend through the base substrate 102, the doped epitaxial layer 114, and the epitaxial material 104. In some embodiments, the dopant concentration profile along cross-sectional lines A-A' and B-B' may be substantially the same. It will be appreciated that the doped epitaxial layer 114 disclosed herein may have various dopant concentration profiles. For example, FIGS. 8B-8D illustrate some embodiments of graphs showing a dopant concentration along cross-sectional lines A-A' and B-B' of FIG. 8A.

Figure 8B:
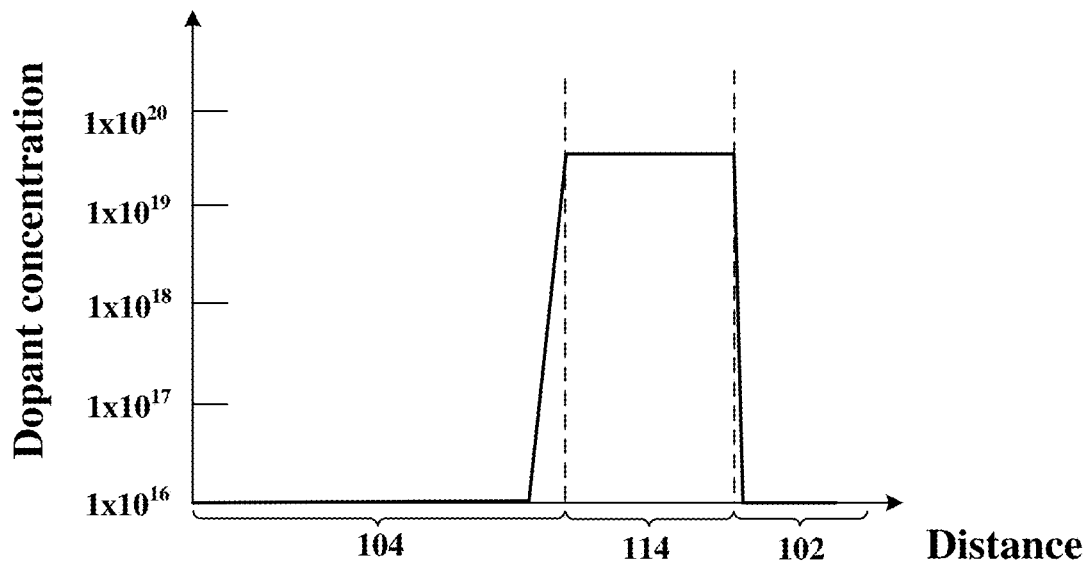
FIGS. 8B-8D illustrate graphs showing various embodiments of dopant concentration profiles along a cross-sectional line of the image sensing structure of FIG. 8A.

As shown in graph 802 of FIG. 8B, in some embodiments the dopant concentration profile has a first value that is substantially constant through a majority of the epitaxial material 104. The dopant concentration profile rapidly increases (e.g., over a distance that is in a range of between approximately 5 Å and approximately 100 Å) along an edge of the epitaxial material 104 to a second value that is greater than the first value. Within the doped epitaxial layer 114 the dopant concentration profile is substantially constant at the second value. Within the base substrate 102 the dopant concentration profile decreases to a third value that is less than the second value. In some embodiments, the first value may be equal to approximately 1e16 atoms/cm$^3$, the second value may be in a range of between of between approximately 1e19 atoms/cm$^3$ and approximately 1e20 atoms/cm$^3$, and the third value may be equal to approximately 1e16 atoms/cm$^3$. In other embodiments, the first value, the second value, and the third value may have different values.

Figure 8C:
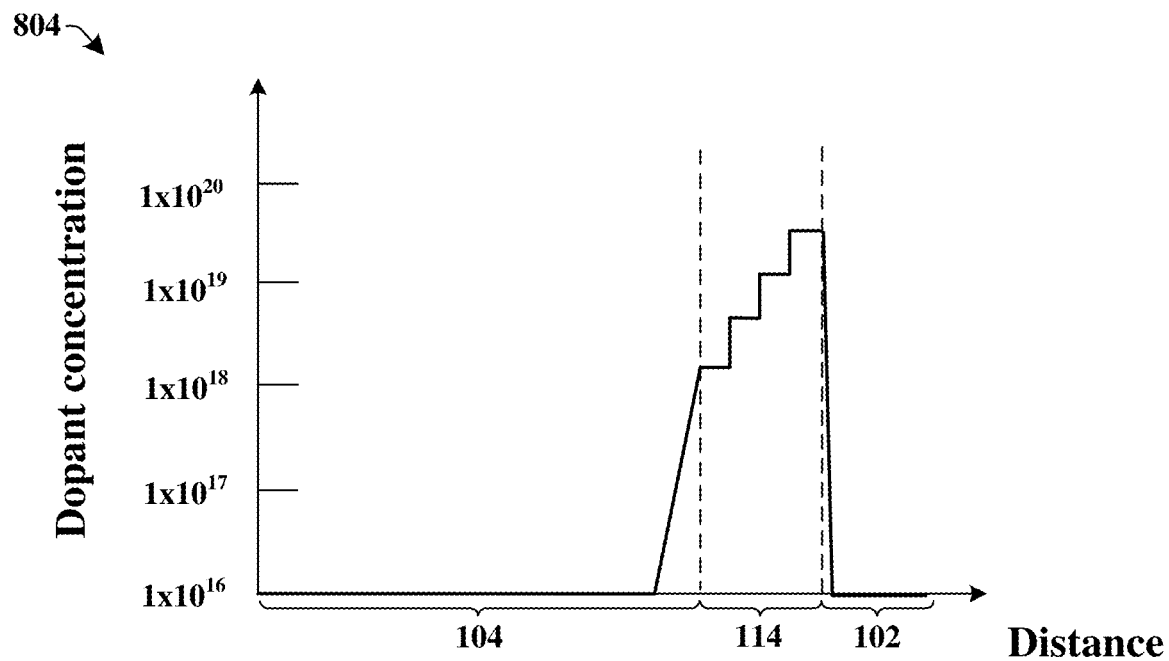

As shown in graph 804 of FIG. 8C, in some embodiments the dopant concentration profile within the doped epitaxial layer 114 has a stepped profile that increases in steps between a plurality of different values.

Figure 8D:
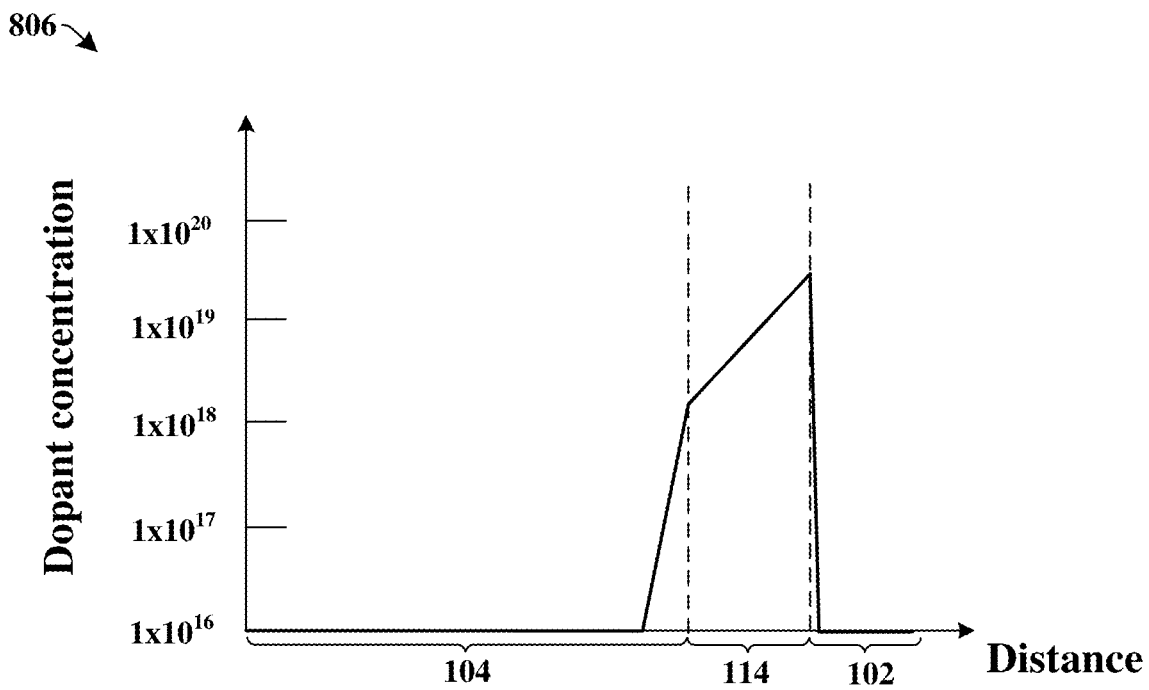

As shown in graph 806 of FIG. 8D, in some embodiments the dopant concentration profile within the doped epitaxial layer 114 has a gradient profile that increases gradually between a second value and a fourth value.

Figure 9A:
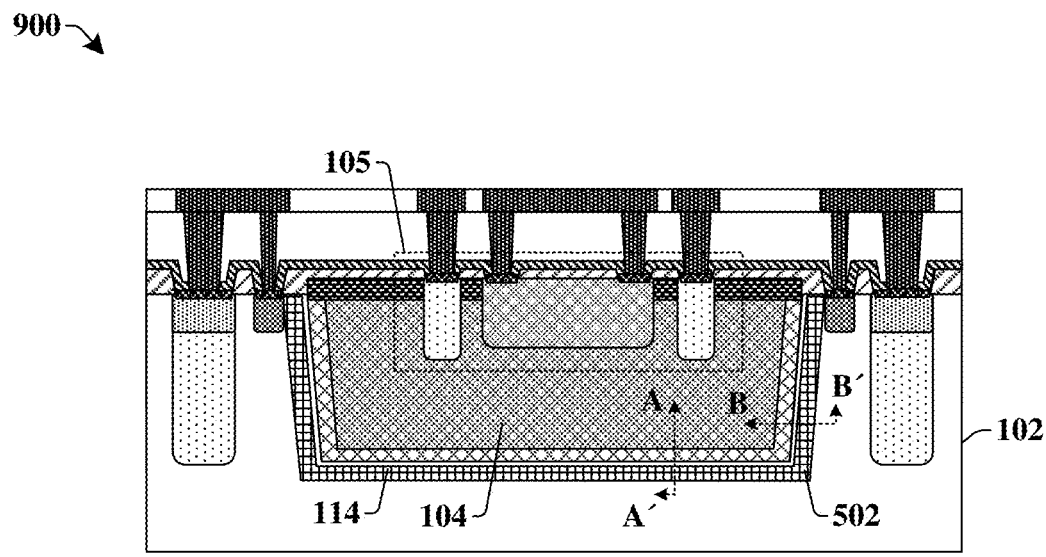
FIG. 9A illustrates a cross-sectional view of some embodiments of an image sensing structure comprising a disclosed doped epitaxial layer.

FIG. 9A illustrates a cross-sectional view of some additional embodiments of an image sensing structure 900 comprising a disclosed doped epitaxial layer.

The image sensing structure 900 comprises an epitaxial material 104 disposed within a recess defined by interior surfaces of a base substrate 102. A doped epitaxial layer 114 extends along an interface between the base substrate 102 and the epitaxial material 104. An additional doped region 502 is disposed within the base substrate 102 along outer edges of the doped epitaxial layer 114.

Figure 9B:
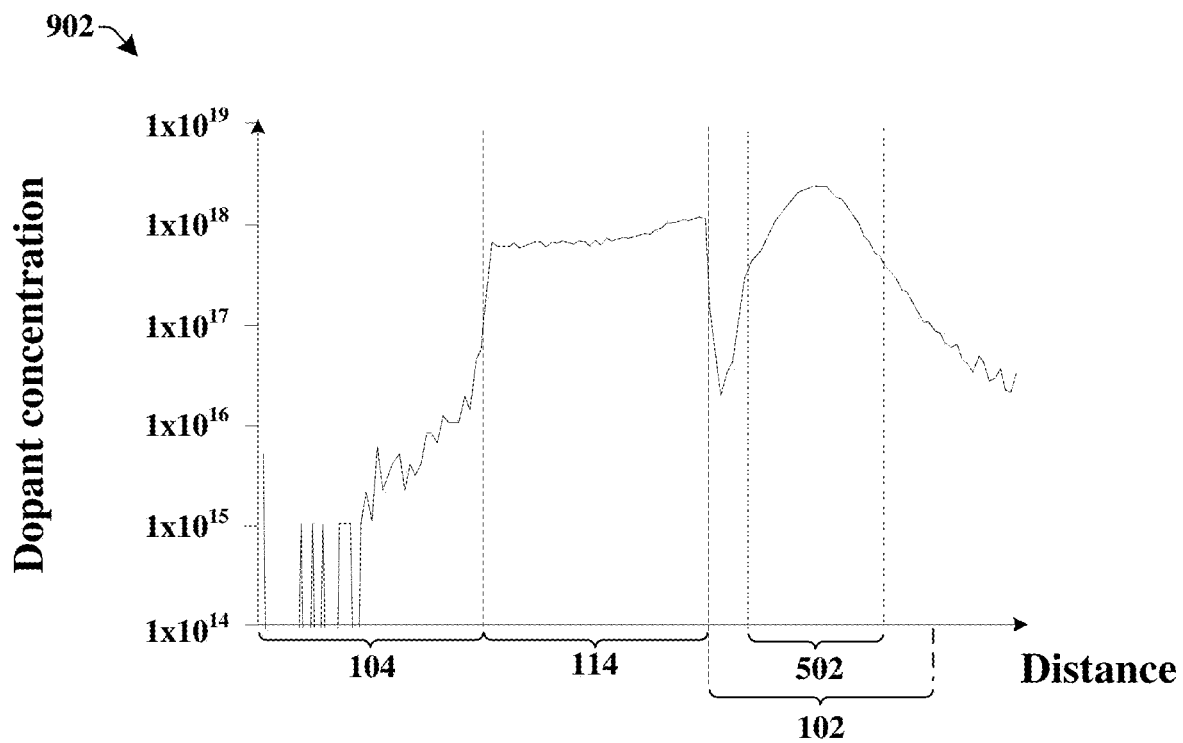
FIG. 9B illustrates a graph showing some embodiments of a dopant concentration profile along a cross-sectional line of the image sensing structure of FIG. 9A.

FIG. 9B illustrates some embodiments of a graph 902 showing a dopant concentration profile along cross-sectional lines A-A' and B-B' of FIG. 9A. As shown in graph 902, a dopant concentration within the epitaxial material 104 and/or the doped epitaxial layer 114 increases abruptly over a short distance, so as to limit a depth to which a high dopant concentration extends into the epitaxial material 104 and thereby limit negative effects of the dopants on a photodetector (e.g., 105 of FIG. 9A) within the epitaxial material 104. In some embodiments, a doping concentration within the epitaxial material 104 changes by an order of magnitude over a distance that is less than or equal to approximately 1000 Angstroms. For example, in some embodiments a doping concentration within the epitaxial material 104 may change from approximately 1e16 atoms/cm$^3$ to approximately 1e17 atoms/cm$^3$ over a distance that is less than or equal to approximately 1000 Angstroms. In some additional embodiments, a doping concentration within the epitaxial material 104 may change from approximately 1e16 atoms/cm$^3$ to approximately 5e17 atoms/cm$^3$ over a distance that is less than or equal to approximately 1000 Angstroms. In some embodiments, the dopant concentration profile has a relatively high dopant concentration (e.g., greater than or equal to 1e17 atoms/cm$^3$) within the doped epitaxial layer 114 and within the additional doped region 502.

Figure 10:
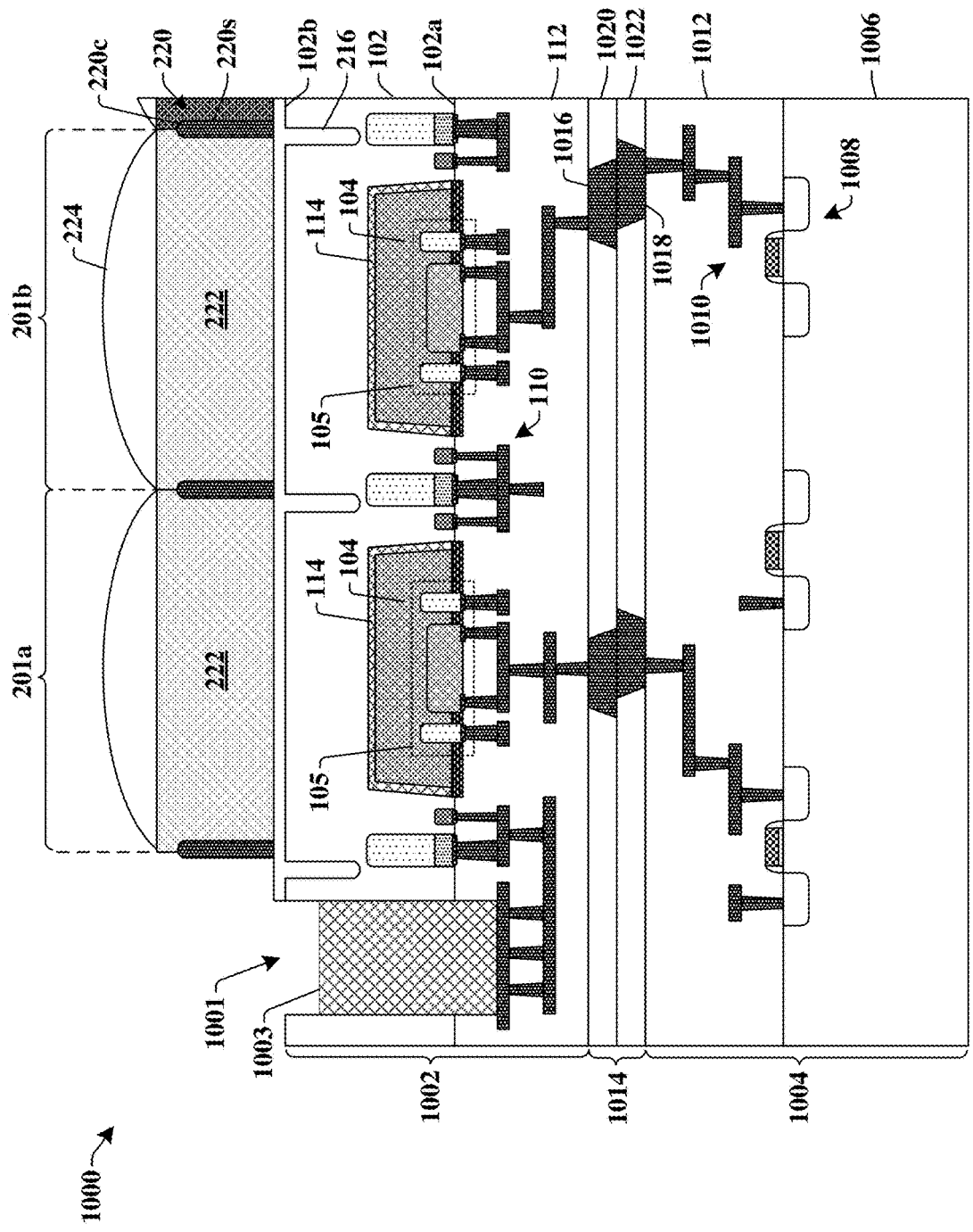
FIG. 10 illustrates a cross-sectional view of some embodiments of a multi-dimensional integrated chip structure comprising a doped epitaxial layer disposed along exterior surfaces of an epitaxial material comprising a photodetector.

FIG. 10 illustrates a cross-sectional view of some embodiments of a multi-dimensional integrated chip structure 1000 comprising a doped epitaxial layer disposed along exterior surfaces of an epitaxial material comprising a photodetector.

The multi-dimensional integrated chip structure 1000 comprises a plurality of tiers 1002-1004 stacked onto one another. The plurality of tiers 1002-1004 comprise a first tier 1002 including a base substrate 102 having a plurality of pixel regions 201a-201b respectively comprising a photodetector 105 disposed within an epitaxial material 104 having a doped epitaxial layer 114 along an interface between the epitaxial material 104 and the base substrate 102. The first tier 1002 further comprises a dielectric structure 112 disposed on a first surface 102a (e.g., a front surface) of the base substrate 102. A plurality of interconnects 110 are disposed within the dielectric structure 112. In some embodiments, the base substrate 102 may have sidewalls extending through the base substrate 102 and defining a bond pad opening 1001. A bond pad 1003 is arranged between the sidewalls of the base substrate 102.

A grid structure 220 is disposed on a second surface 102b (e.g., a back surface) of the base substrate 102 along opposing sides of the plurality of pixel regions 201a-201b. In some embodiments, the grid structure 220 comprises a curved surface 220c that is disposed between sidewalls 220s of the grid structure 220 and that faces away from the base substrate 102.

An isolation structure 216 is arranged within one or more trenches extending into the second surface 102b of the base substrate 102 along opposing sides of the plurality of pixel regions 201. In some embodiments, the one or more trenches are defined by sidewalls of the base substrate 102, which are coupled to a curved lower surface of the base substrate 102. In some embodiments, the one or more trenches may extend into the base substrate 102 to a depth that is greater than a height of the grid structure 220. In some embodiments, the one or more trenches may be laterally offset from the grid structure 220 by a non-zero distance. For example, a line bisecting a trench may be laterally separated from a line bisecting a closest grid structure, as viewed in a cross-sectional view.

The plurality of tiers 1002-1004 further comprise a second tier 1004 including an additional substrate 1006 and an additional dielectric structure 1012. In some embodiments, one or more transistor device 1008 are disposed within the additional substrate 1006. A plurality of additional interconnects 1010 are disposed within the additional dielectric structure 1012 and are coupled to one or more of the transistor devices 1008.

The first tier 1002 is bonded to the second tier 1004 by way of a bonding structure 1014 comprising a first bonding pad 1016 and a second bonding pad 1018. In some embodiments, the first bonding pad 1016 may be disposed within a first passivation layer 1020 on the dielectric structure 112 and the second bonding pad 1018 may be disposed within a second passivation layer 1022 on the additional dielectric structure 1012. In some embodiments, the bonding structure 1014 may comprise a hybrid bonding structure having a first interface between the first bonding pad 1016 and the second bonding pad 1018 and a second interface between the first passivation layer 1020 and the second passivation layer 1022. In some embodiments, the first bonding pad 1016 and the second bonding pad 1018 may comprise a metal such as aluminum, copper, tungsten, or the like. In some embodiments, the first bonding pad 1016 and the second bonding pad 1018 may respectively comprise a conductive core copper core and a surrounding barrier layer (e.g., comprising a refractory metal such as tantalum, titanium, or the like). In some embodiments, the first bonding pad 1016 contacts the second bonding pad 1018 and the second passivation layer 1022. In some embodiments, the first bonding pad 1016 and the second bonding pad 1018 are substantially trapezoidal shapes that contact one another a largest base of the substantially trapezoidal shapes.

FIGS. 11-29 illustrate cross-sectional views 1100-2900 of some embodiments of a method of forming an integrated chip structure comprising a doped epitaxial layer disposed along exterior surfaces of an epitaxial material comprising a photodetector. Although FIGS. 11-29 are described in relation to a method, it will be appreciated that the structures disclosed in FIGS. 11-29 are not limited to such a method, but instead may stand alone as structures independent of the method.

Figure 11:
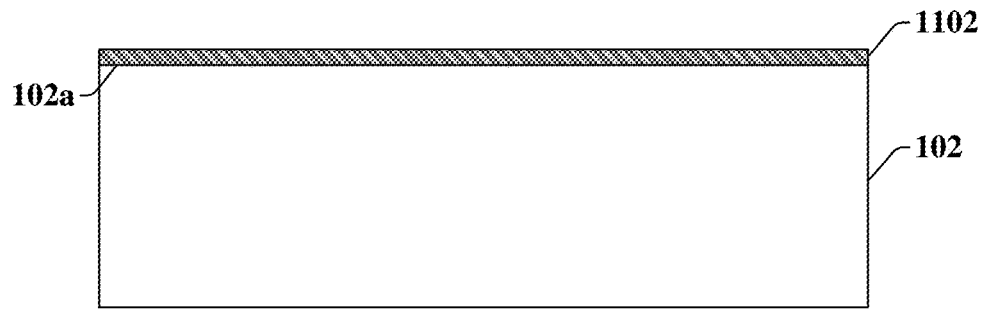
FIGS. 11-29 illustrate cross-sectional views of some additional embodiments of a method of forming an integrated chip structure comprising a doped epitaxial layer disposed along exterior surfaces of an epitaxial material comprising a photodetector.

As shown in cross-sectional view 1100 of FIG. 11, a sacrificial dielectric 1102 is formed over a first surface 102a of a base substrate 102. In various embodiments, the base substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In various embodiments, the sacrificial dielectric 1102 may comprise an oxide, a nitride, or the like. In some embodiments, the sacrificial dielectric 1102 may be formed by a thermal oxidation process (e.g., a wet thermal oxidation process, a dry thermal oxidation process, or the like). In other embodiments, the sacrificial dielectric 1102 may be formed by a deposition process (e.g., chemical vapor deposition (CVD) process, a plasma enhanced chemical vapor deposition (PE-CVD) process, an atomic layer deposition (ALD) process, a physical vapor deposition (PVD) process, a molecular organic chemical vapor deposition (MOCVD) process, or the like).

Figure 12:
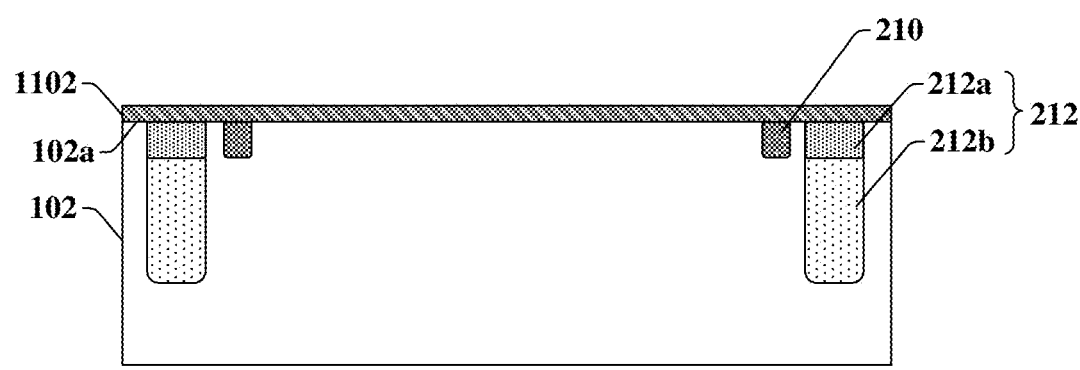

As shown in cross-sectional view 1200 of FIG. 12, one or more doped isolation regions are formed within the base substrate 102. The one or more doped isolation regions may comprise a first doped isolation region 210 having a first doping type and a second doped isolation region 212 having a second doping type that is different than the first doping type. In some embodiments, the first doped isolation region 210 may be formed by a first implantation process that implants a first dopant type (e.g., boron, aluminum, gallium, or the like) into the base substrate 102 according to a first implant mask (not shown). In some embodiments, the second doped isolation region 212 may be formed by one or more additional implantation processes that implant a second dopant type (e.g., phosphorus, arsenic, antimony, or the like) into the base substrate 102 according to a second implant mask (not shown). In some embodiments, the one or more additional implantation processes may comprise separate implantation processes that form a first part 212a of the second doped isolation region 212 and a second part 212b of the second doped isolation region 212. The first implantation process and the one or more additional implantation processes may be performed with the sacrificial dielectric 1102 in place over the base substrate 102, so that the implantation processes implant dopants through the sacrificial dielectric 1102.

Figure 13:
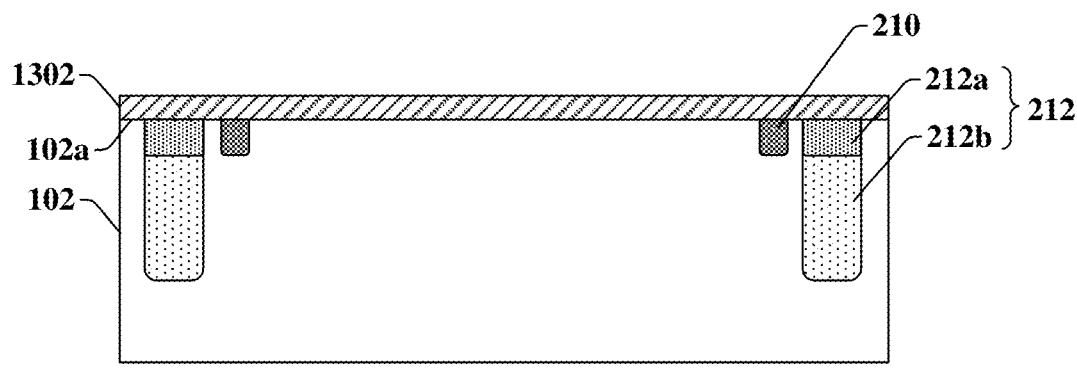

As shown in cross-sectional view 1300 of FIG. 13, the sacrificial dielectric (1102 of FIG. 12) is removed from over the first surface 102a of the base substrate 102. An intermediate first dielectric material 1302 is subsequently formed on the first surface 102a of the base substrate 102 after removal of the sacrificial dielectric. In some embodiments, the intermediate first dielectric material 1302 may comprise an oxide (e.g., silicon dioxide), a nitride (e.g., silicon oxynitride), or the like. In some embodiments, the intermediate first dielectric material 1302 may be formed by a deposition process (e.g., CVD process, a PE-CVD process, an ALD process, a PVD process, a MOCVD process, or the like).

Figure 14:
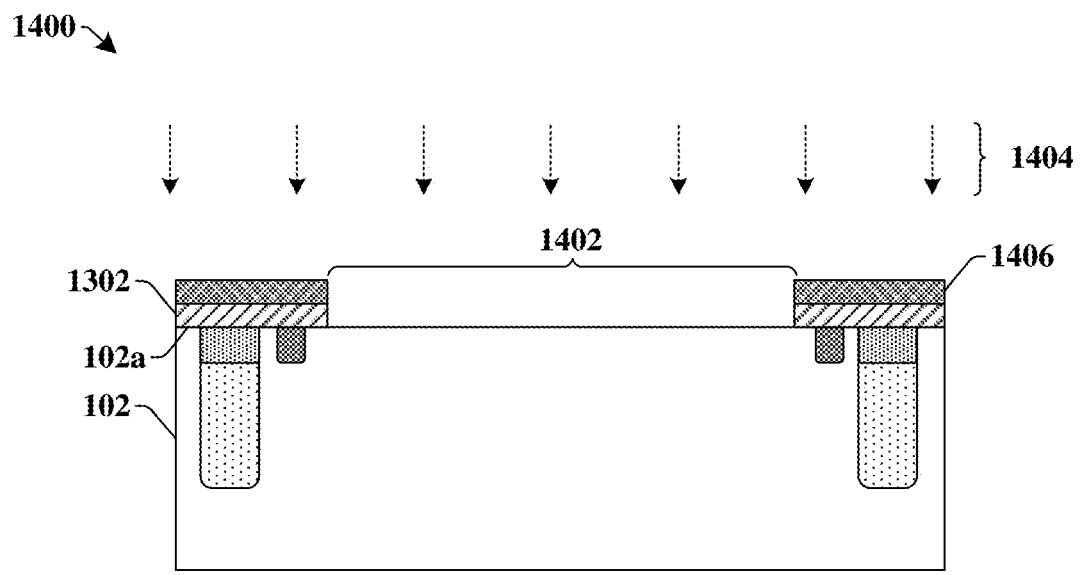

As shown in cross-sectional view 1400 of FIG. 14, a first patterning process is performed on the intermediate first dielectric material 1302 to form an opening 1402 that extends through the intermediate first dielectric material 1302 and that exposes a part of the first surface 102a of the base substrate 102. In some embodiments, the first patterning process may be performed by selectively exposing the intermediate first dielectric material 1302 to a first etchant 1404 according to a first mask 1406. In some embodiments, the first etchant 1404 may comprise a dry etchant (e.g., a reactive ion etchant, a sputter etchant, or the like). In some embodiments, the first mask 1406 may comprise photoresist, a hard mask, or the like.

Figure 15:
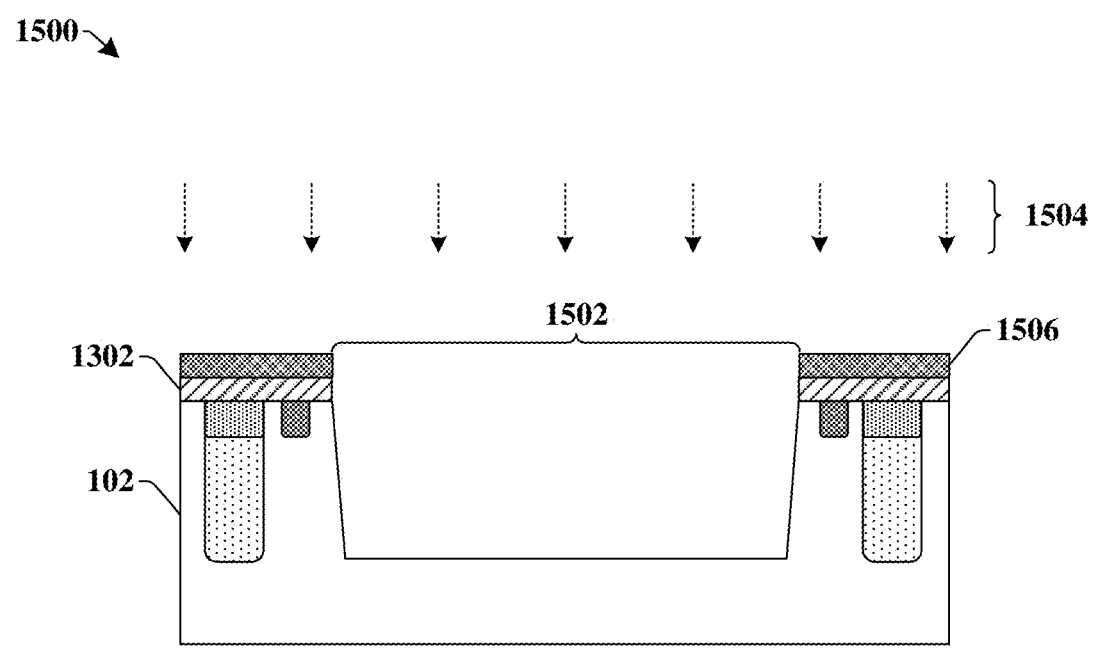

As shown in cross-sectional view 1500 of FIG. 15, a second patterning process is performed on the exposed part of the first surface 102a of the base substrate 102. The second patterning process removes a part of the base substrate 102 to form a recess 1502 defined by one or more interior surfaces of the base substrate 102. In some embodiments, the recess 1502 may be formed to have a depth that is in a range of between approximately 1 micron and approximately 3 microns, and a width that is in a range of between approximately 2 microns and approximately 10 microns. In some embodiments, the second patterning process may be performed by selectively exposing the base substrate 102 to a second etchant 1504 according to a second mask 1506. In some embodiments, the second etchant 1504 may comprise a dry etchant (e.g., a reactive ion etchant, a sputter etchant, or the like). In some embodiments, the second mask 1506 may comprise photoresist, a hard mask, or the like. In some additional embodiments, the second mask 1506 may comprise the intermediate first dielectric material 1302.

Figure 16:
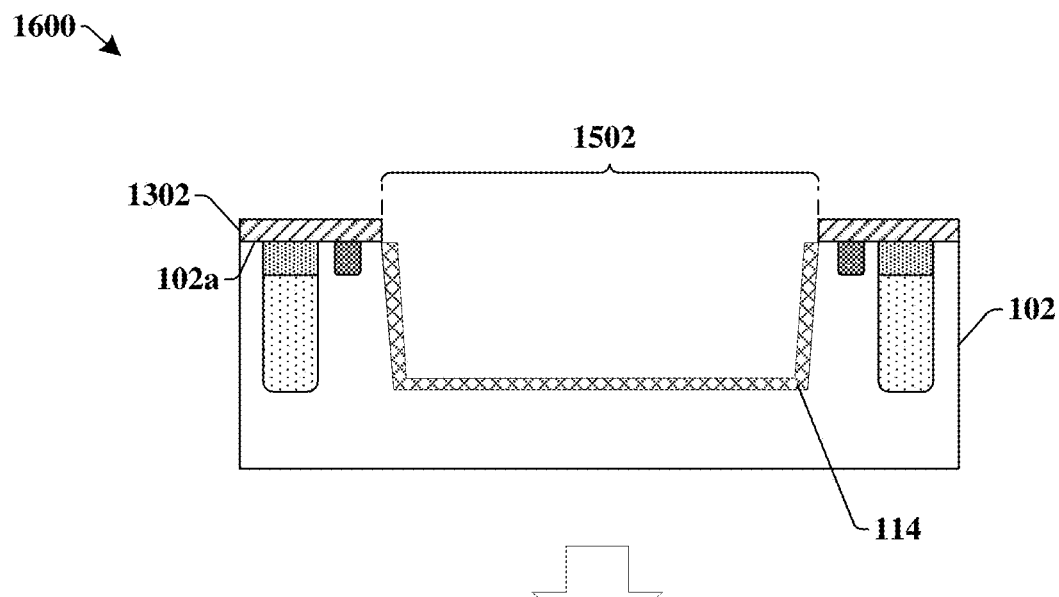
Figure 16:
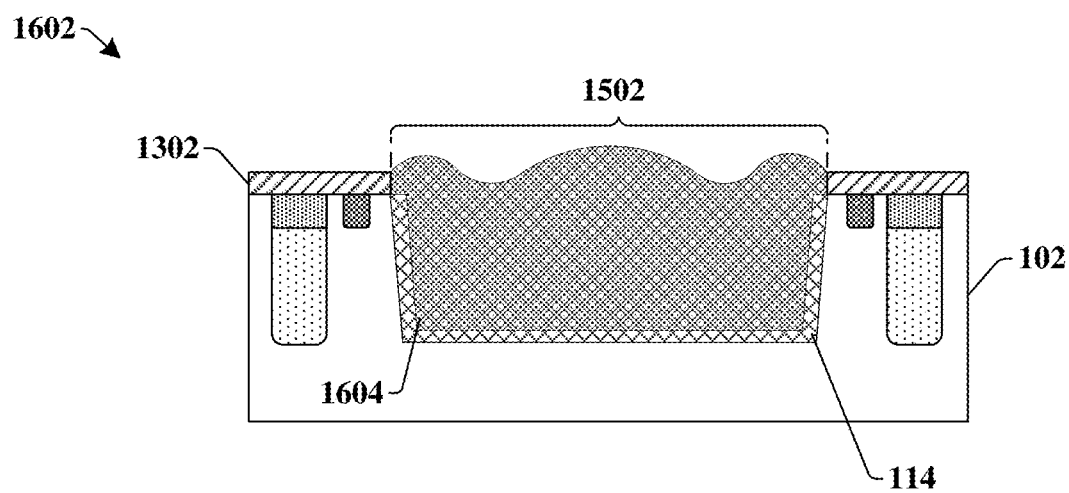

As shown in cross-sectional view 1600 of FIG. 16, a doped epitaxial layer 114 is formed within the recess 1502 and along the one or more interior surfaces of the base substrate 102. In some embodiments, the doped epitaxial layer 114 may be formed by way of a first deposition process that introduces a dopant into an epitaxial material during the first deposition process (e.g., so that the doped epitaxial layer 114 is doped concurrent to its formation along the one or more interior surfaces of the base substrate 102). Forming the doped epitaxial layer 114 by way of the first deposition process allows for the dopant within the doped epitaxial layer 114 to be formed over a relatively small width. Furthermore, it does not require the use of a photomask (e.g., in comparison to implantation processes) and/or activation anneal, thereby reducing a cost of the fabrication process.

In various embodiments, the first deposition process may comprise a chemical vapor deposition (CVD) process, a physical vapor deposition (PVD) process, an epitaxial growth process, or the like. In some embodiments, the first deposition process may be performed by introducing a boron containing gas (e.g., diborane) into a process chamber during deposition of an epitaxial material. In various embodiments, the doped epitaxial layer 114 may comprise silicon, germanium, silicon germanium, or the like. In some embodiments, the doped epitaxial layer 114 may be formed to a thickness that is in a range of between approximately 100 Å and approximately 10000 Å, between approximately 100 Å and approximately 5000 Å, between approximately 100 Å and approximately 1000 Å, or other similar values. In some embodiments, the first deposition process may be performed in a process chamber held at a pressure that is between approximately 5 torr and approximately 200 torr. In other embodiments, the first deposition process may be performed in a process chamber held at an atmospheric pressure.

In some embodiments (not shown), additional doped epitaxial layers may be formed over the doped epitaxial layer 114 using subsequent deposition processes. For example, in some embodiments, the doped epitaxial layer 114 may be formed by way of a first deposition process that forms a first doped semiconductor material onto the base substrate 102 and a second doped epitaxial layer may be formed by way of an additional deposition process that forms a second doped semiconductor material onto the first doped semiconductor material.

As shown in cross-sectional view 1602 of FIG. 16, an intermediate epitaxial material 1604 is formed within the recess 1502 and along interior surfaces of the doped epitaxial layer 114. In some embodiments, the intermediate epitaxial material 1604 may be formed by way of a second deposition process that does not introduce the dopant into the intermediate epitaxial material 1604. In various embodiments, the second deposition process may comprise a CVD process, a PVD process, an epitaxial growth process, or the like. In some embodiments, the second deposition process may be performed by discontinuing an introduction of a boron containing gas (e.g., diborane) into the process chamber during a deposition (e.g., a piecewise deposition, a continuous deposition, etc.) that forms the doped epitaxial layer 114 and the intermediate epitaxial material 1604. In other embodiments, the second deposition process may be performed by introduction of a new set of gases into a process chamber. In various embodiments, the intermediate epitaxial material 1604 may comprise germanium, silicon germanium, or the like. In some embodiments, during formation of the intermediate epitaxial material 1604, dopants from within the doped epitaxial layer 114 may diffuse to within the base substrate 102 resulting a dopant concentration profile that decreases within the base substrate 102 over a depth that is in a range of between approximately 5 Å and approximately 100 Å, for example.

Figure 17:
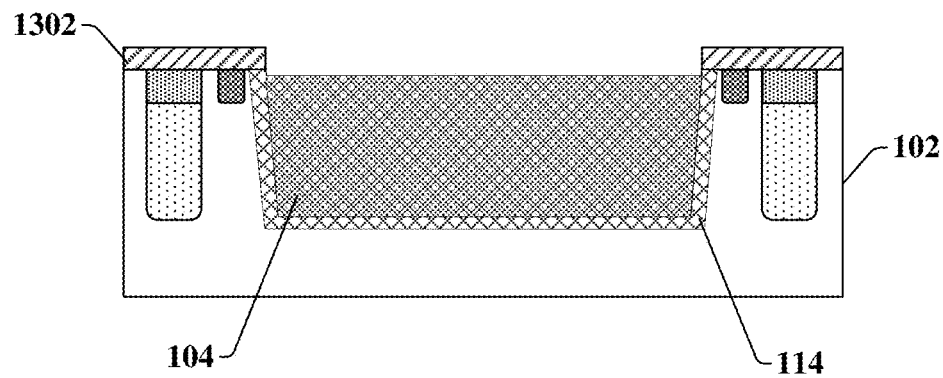

As shown in cross-sectional view 1700 of FIG. 17, a part of the intermediate epitaxial material (1604 of FIG. 16) is removed from over the intermediate first dielectric material 1302 to form an epitaxial material 104. In some embodiments, the part of the intermediate epitaxial material is removed by way of an etching process. In other embodiments, the part of the intermediate epitaxial material is removed by way of a planarization process (e.g., a chemical mechanical planarization (CMP) process). In some embodiments, the epitaxial material 104 may be recessed below an upper surface of the first dielectric material 304. In other embodiments, the epitaxial material 104 may have an upper surface that is substantially co-planar (e.g., co-planar within a tolerance of a CMP process) with an upper surface of the intermediate first dielectric material 1302. In some such embodiments, the doped epitaxial layer 114 may have an uppermost surface that is above the first surface 102a of the base substrate 102.

Figure 18:
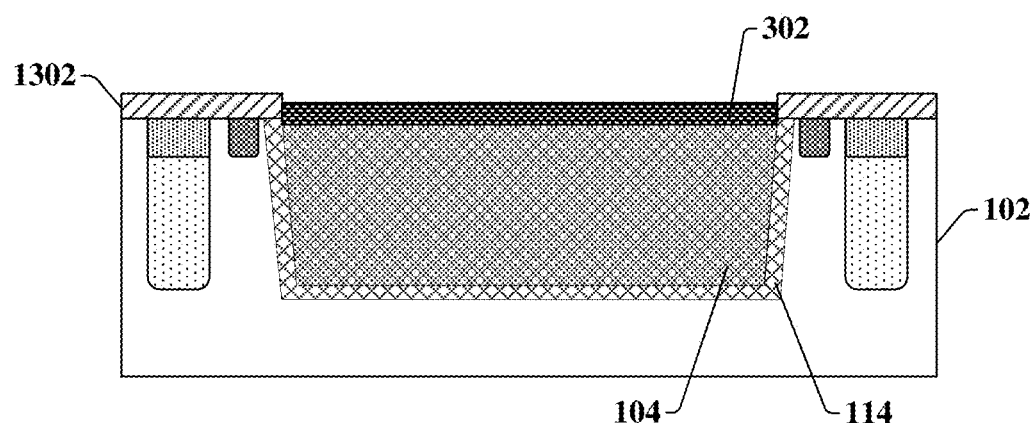

As shown in cross-sectional view 1800 of FIG. 18, a cap layer 302 is formed on the epitaxial material 104. The cap layer 302 may be formed onto the epitaxial material 104 and directly between sidewalls of the intermediate first dielectric material 1302. In some embodiments, the cap layer 302 may comprise an oxide, a nitride, or the like. In various embodiments, the cap layer 302 may be formed by way of a deposition process (e.g., a CVD process, a PE-CVD process, an ALD process, a PVD process, a MOCVD process, or the like).

Figure 19:
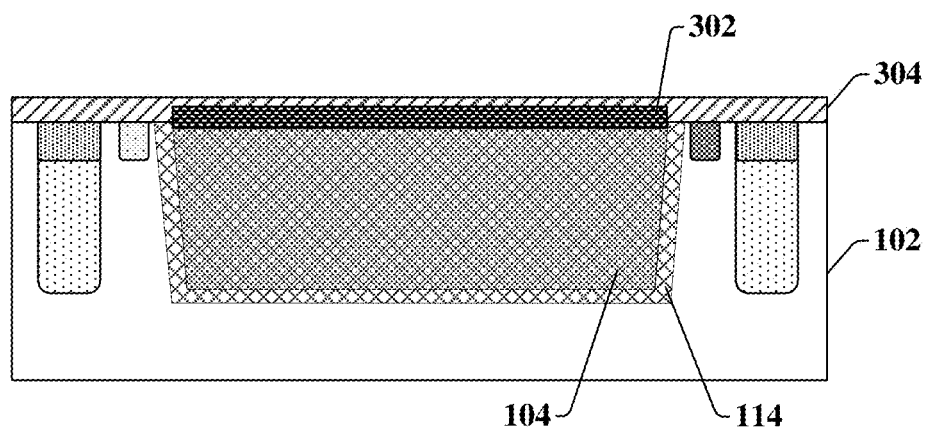

As shown in cross-sectional view 1900 of FIG. 19, the intermediate first dielectric material (e.g., 1302 of FIG. 18) is modified to form a first dielectric material 304. The first dielectric material 304 has a greater thickness than the intermediate first dielectric material and extends over the cap layer 302. In some embodiments, the intermediate first dielectric material may be modified by way of a deposition process (e.g., a CVD process, a PE-CVD process, an ALD process, a PVD process, a MOCVD process, or the like).

Figure 20:
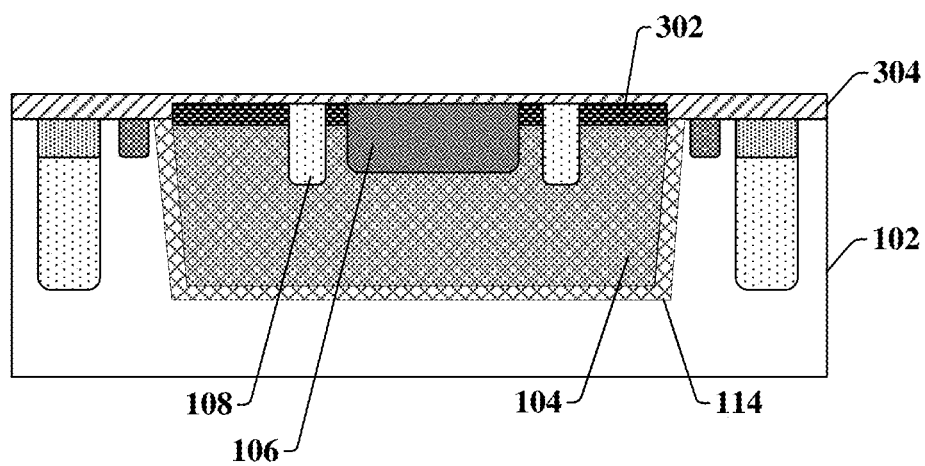

As shown in cross-sectional view 2000 of FIG. 20, a first doped photodiode region 106 and a second doped photodiode region 108 are formed within the epitaxial material 104. In some embodiments, the first doped photodiode region 106 may be formed by a third implantation process that implants a first dopant type (e.g., boron, aluminum, gallium, or the like) into the epitaxial material 104 and cap layer 302 according to a third implant mask (not shown). In some embodiments, the second doped photodiode region 108 may be formed by a fourth implantation process that implants a second dopant type (e.g., phosphorus, arsenic, antimony, or the like) into the epitaxial material 104 and cap layer 302 according to a fourth implant mask (not shown).

Figure 21:
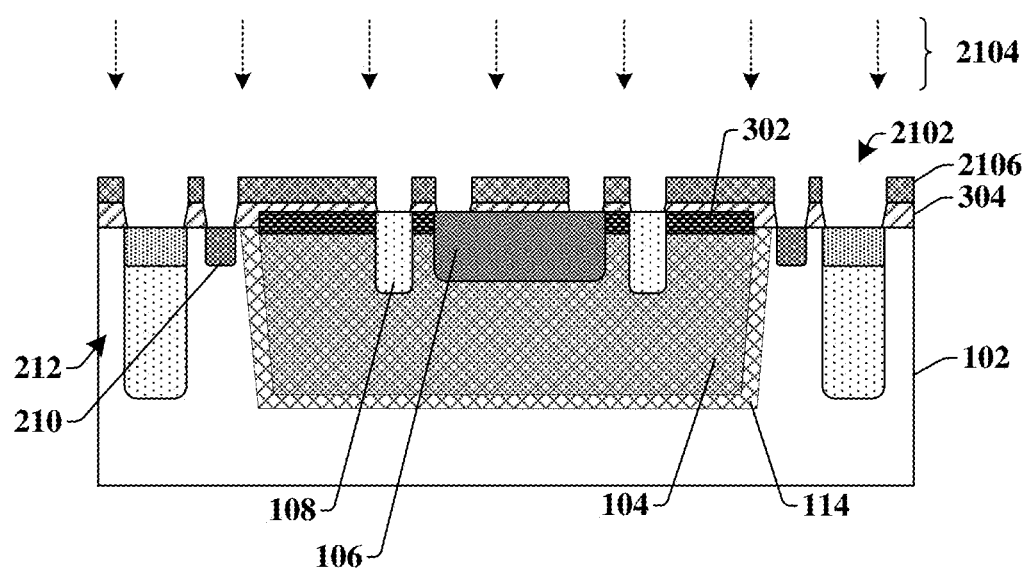

As shown in cross-sectional view 2100 of FIG. 21, a third patterning process is performed to selective etch the first dielectric material 304 to define a first plurality of contact openings 2102 extending through the first dielectric material 304. The first plurality of contact openings 2102 expose the first doped photodiode region 106, the second doped photodiode region 108, the first doped isolation region 210, and the second doped isolation region 212. In some embodiments, the third patterning process may be performed by selectively exposing the first dielectric material 304 to a third etchant 2104 according to a third masking layer 2106. In some embodiments, the third etchant 2104 may comprise a dry etchant (e.g., a reactive ion etchant, a sputter etchant, or the like). In some embodiments, the third masking layer 2106 may comprise photoresist, a hard mask, or the like.

Figure 22:
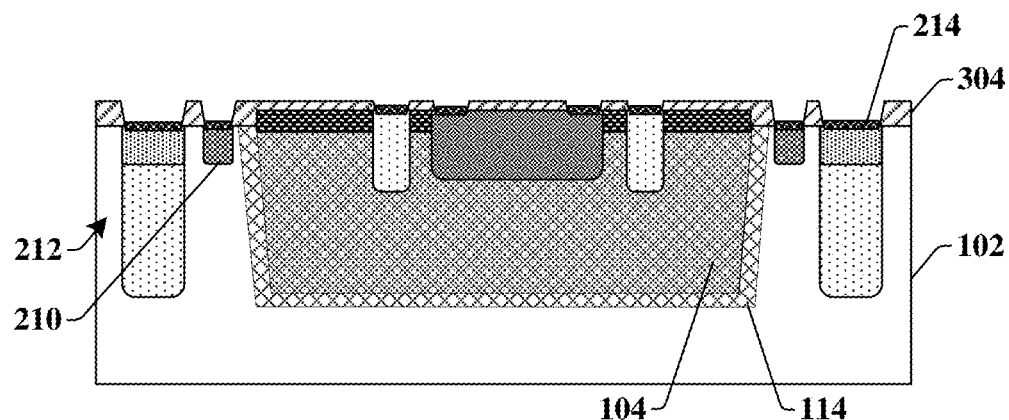

As shown in cross-sectional view 2200 of FIG. 22, a salicidation process is performed to form a silicide 214 on the first doped photodiode region 106, the second doped photodiode region 108, the first doped isolation region 210, and the second doped isolation region 212. In some embodiments, the salicidation process may be performed by depositing a nickel layer and then performing a thermal annealing process (e.g., a rapid thermal anneal) to form a silicide 214 comprising nickel.

Figure 23:
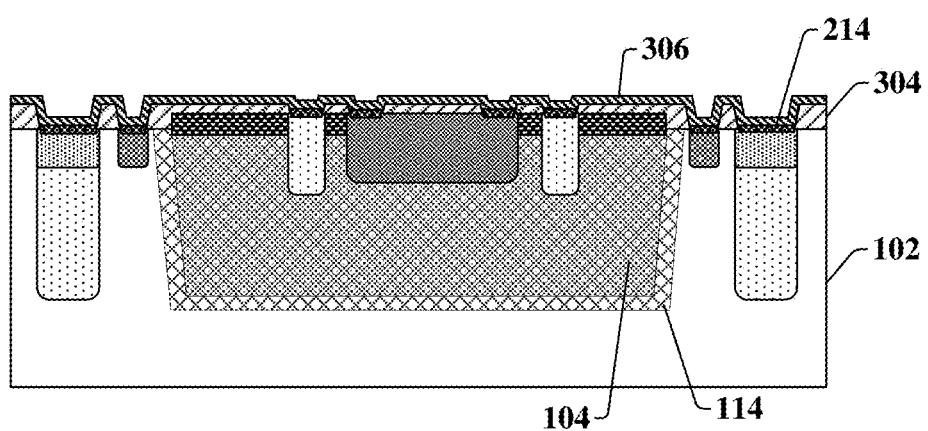

As shown in cross-sectional view 2300 of FIG. 23, a contact etch stop layer (CESL) 306 is formed onto the first dielectric material 304 and the silicide 214. In some embodiments, the CESL 306 may comprise a carbide (e.g., silicon carbide, silicon oxycaribide, etc.), a nitride (e.g., silicon nitride, silicon oxynitride, etc.), or the like. In some embodiments, the CESL 306 may be formed by way of a deposition process (e.g., a CVD process, a PE-CVD process, an ALD process, a PVD process, a MOCVD process, or the like).

Figure 24:
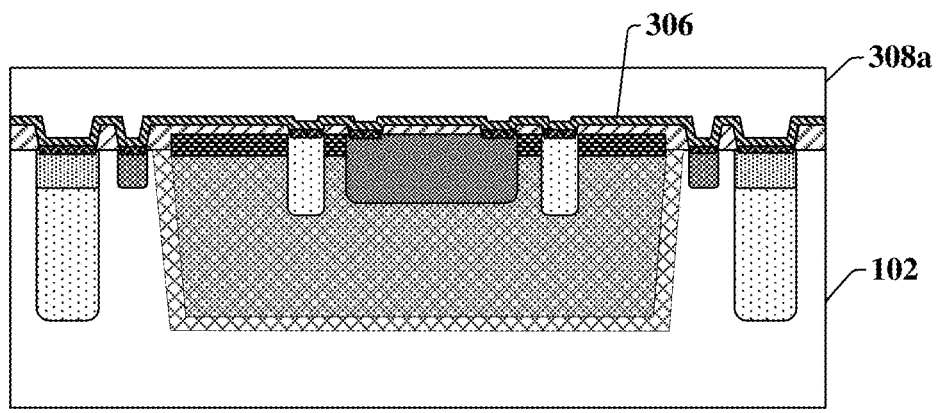

As shown in cross-sectional view 2400 of FIG. 24, a first ILD layer 308a is formed onto the CESL 306. In some embodiments, the first ILD layer 308a may comprise an oxide (e.g., silicon oxide), a low-k dielectric material, or the like. In various embodiments, the first ILD layer 308a may be formed by way of a deposition process (e.g., a CVD process, a PE-CVD process, an ALD process, a PVD process, a MOCVD process, or the like).

Figure 25:
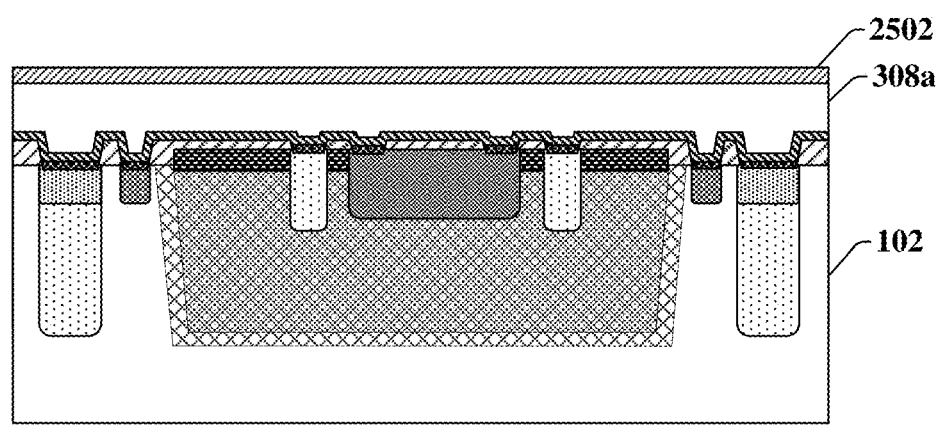
Figure 26:
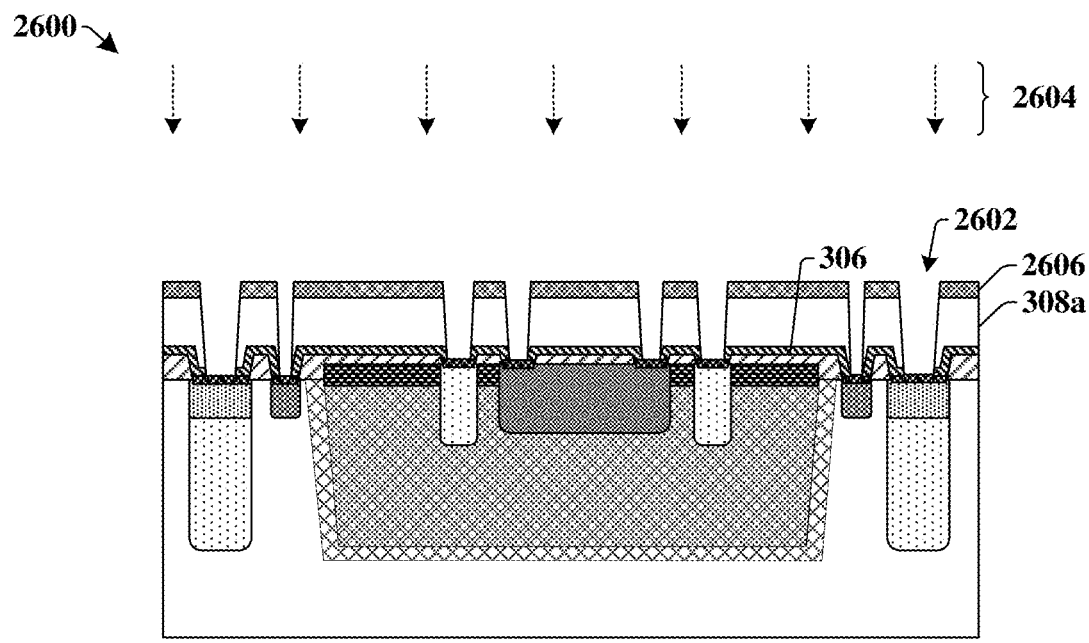

As shown in cross-sectional view 2500 of FIG. 25, an anti-reflective coating 2502 is formed onto the first ILD layer 308a. The anti-reflective coating 2502 is configured to mitigate reflectivity of incident radiation used in a photolithography process, so as to mitigate critical dimension (CD) errors. In various embodiments, the anti-reflective coating 2502 may be formed by way of a deposition process (e.g., a CVD process, a PE-CVD process, an ALD process, a PVD process, a MOCVD process, or the like).

As shown in cross-sectional view 2600, a fourth patterning process is performed to selective etch the first ILD layer 308a and the CESL 306 so as to define a second plurality of contact openings 2602 extending through the first ILD layer 308a and the CESL 306. In some embodiments, the fourth pattering process may be performed by selectively exposing the first ILD layer 308a and the CESL 306 to a fourth etchant 2604 according to a fourth masking layer 2606. In some embodiments, the fourth etchant 2604 may comprise a dry etchant (e.g., a reactive ion etchant, a sputter etchant, or the like). In some embodiments, the fourth masking layer 2606 may comprise photoresist.

Figure 27:
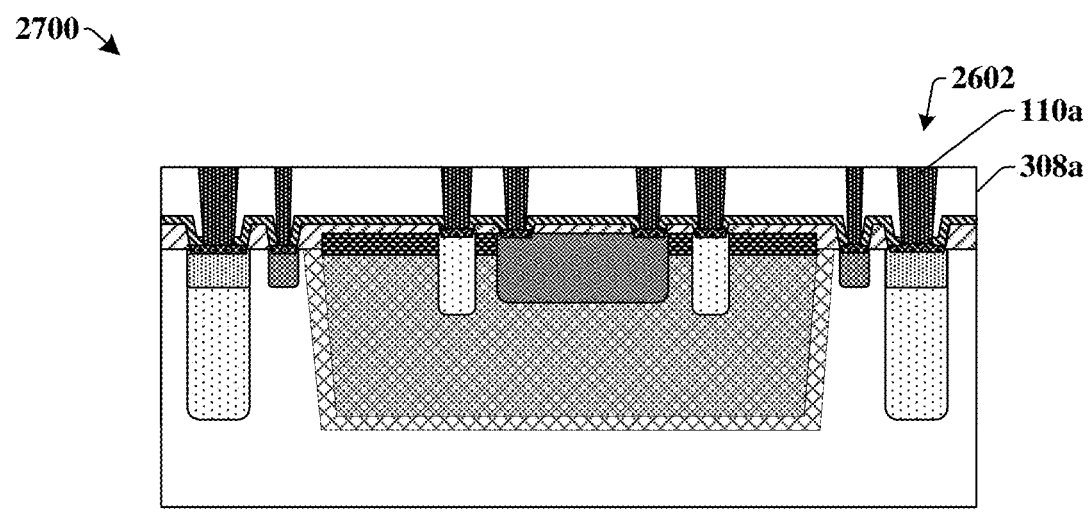

As shown in cross-sectional view 2700 of FIG. 27, a plurality of conductive contacts 110a are formed within the second plurality of contact openings 2602. In some embodiments, the plurality of conductive contacts 110a may be formed by forming a first conductive material within the second plurality of contact openings 2602. A planarization process is subsequently performed to remove excess of the first conductive material from over the first ILD layer 308a. In some embodiments, the planarization process may comprise a chemical mechanical planarization (CMP) process. In some embodiments, the first conductive material may comprise tungsten, ruthenium, copper, gold, or the like.

Figure 28:
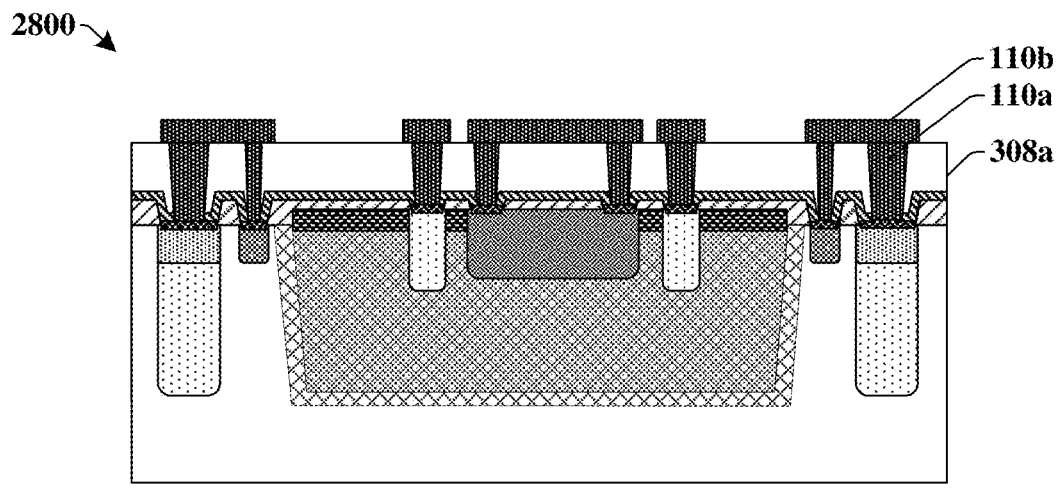

As shown in cross-sectional view 2800 of FIG. 28, an interconnect wire 110b is formed over the first ILD layer 308a and the plurality of conductive contacts 110a. In some embodiments, the interconnect wire 110b may be formed by depositing a second conductive material onto the first ILD layer 308a and the plurality of conductive contacts 110a. The second conductive material is subsequently patterned to define the interconnect wire 110b. In some embodiments, the second conductive material may comprise tungsten, ruthenium, copper, gold, or the like.

Figure 29:
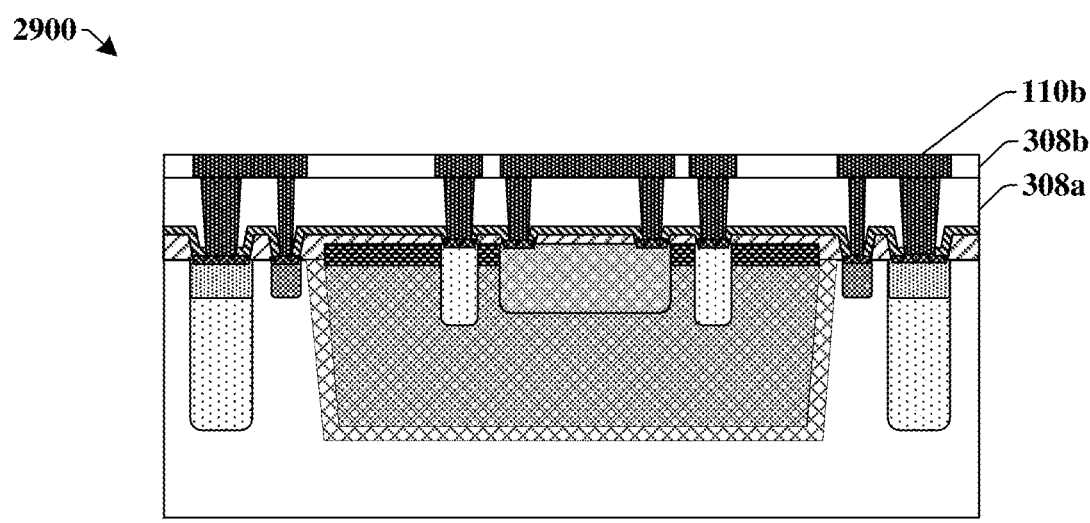

As shown in cross-sectional view 2900 of FIG. 29, a second ILD layer 308b is formed over the first ILD layer 308a and the interconnect wire 110b. In some embodiments, the second ILD layer 308b may comprise an oxide (e.g., silicon oxide), a low-k dielectric material, or the like. In various embodiments, the second ILD layer 308b may be formed by way of a deposition process (e.g., a CVD process, a PE-CVD process, an ALD process, a PVD process, a MOCVD process, or the like).

Figure 30:
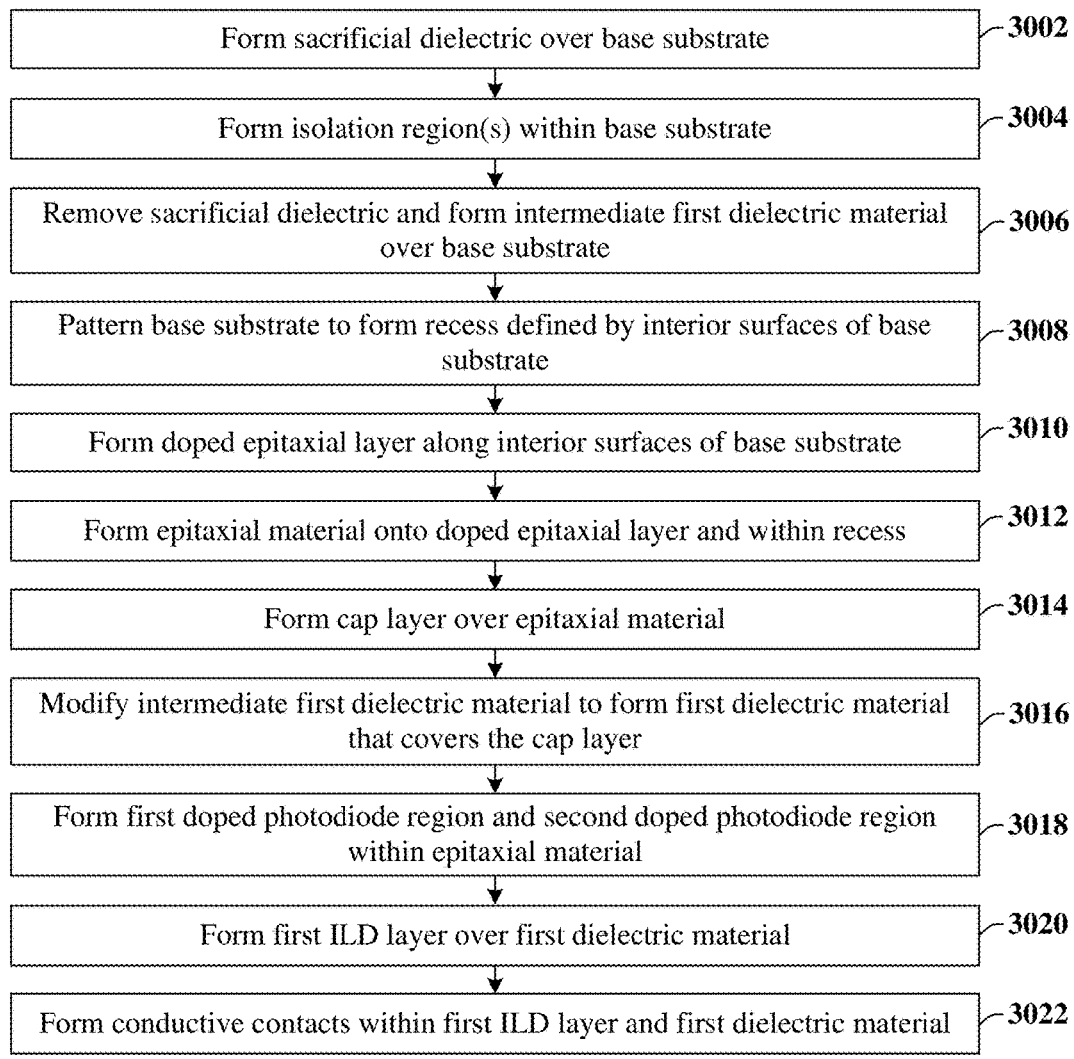
FIG. 30 illustrates a flow diagram of some embodiments of a method of forming an integrated chip structure comprising a doped epitaxial layer disposed along exterior surfaces of an epitaxial material comprising a photodetector.

FIG. 30 illustrates a flow diagram of some embodiments of a method 3000 of forming an integrated chip structure comprising a doped epitaxial layer disposed along exterior surfaces of an epitaxial material comprising a photodetector.

While the disclosed method 3000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3002, a sacrificial dielectric is formed over a base substrate. FIG. 11 illustrates a cross-sectional view 1100 of some embodiments corresponding to act 3002.

At act 3004, one or more isolation regions may be formed within the base substrate. FIG. 12 illustrates a cross-sectional view 1200 of some embodiments corresponding to act 3004.

At act 3006, the sacrificial dielectric is removed from over the first substrate and an intermediate first dielectric material is formed over the base substrate. FIG. 13 illustrates a cross-sectional view 1300 of some embodiments corresponding to act 3006.

At act 3008, the base substrate is patterned to form a recess defined by interior surfaces of the base substrate. FIGS. 14-15 illustrate cross-sectional views 1400-1500 of some embodiments corresponding to act 3008.

At act 3010, a doped epitaxial layer is formed along interior surfaces of the semiconductor substrate defining a recess. FIG. 16 illustrates a cross-sectional view 1600 of some embodiments corresponding to act 3010.

At act 3012, an epitaxial material is formed on the doped epitaxial layer and within the recess. FIGS. 16-17 illustrate cross-sectional views, 1602 and 1700, of some embodiments corresponding to act 3012.

At act 3014, a cap layer is formed over the epitaxial material. FIG. 18 illustrates a cross-sectional view 1800 of some embodiments corresponding to act 3014.

At act 3016, the intermediate first dielectric material is modified to form a first dielectric material that covers the cap layer. FIG. 19 illustrates a cross-sectional view 1900 of some embodiments corresponding to act 3016.

At act 3018, a first doped photodiode region and a second doped photodiode region are formed within the epitaxial material. FIG. 20 illustrates a cross-sectional view 2000 of some embodiments corresponding to act 3018.

At act 3020 a first ILD layer is formed over the first dielectric material. FIG. 24 illustrates a cross-sectional view 2400 of some embodiments corresponding to act 3020.

At act 3022, a plurality of conductive contacts are formed within a first ILD layer and the first dielectric material. FIG. 25 illustrates a cross-sectional view 2500 of some embodiments corresponding to act 3022.

Accordingly, in some embodiments, the present disclosure relates to an integrated chip structure comprising a doped epitaxial layer disposed along exterior surfaces of an epitaxial material comprising a photodetector.

In some embodiments, the present disclosure relates to a method of forming an integrated chip structure. The method includes etching a base substrate to form a recess defined by one or more interior surfaces of the base substrate; forming a doped epitaxial layer along the one or more interior surfaces of the base substrate; forming an epitaxial material on horizontally and vertically extending surfaces of the doped epitaxial layer; forming a first doped photodiode region within the epitaxial material, the first doped photodiode region having a first doping type; and forming a second doped photodiode region within the epitaxial material, the second doped photodiode region having a second doping type. In some embodiments, the method further includes performing a planarization process to remove a part of the epitaxial material after forming the epitaxial material and before forming the first doped photodiode region. In some embodiments, the epitaxial material includes germanium. In some embodiments, the doped epitaxial layer has a substantially constant dopant concentration profile over a width of the doped epitaxial layer. In some embodiments, the doped epitaxial layer has a dopant concentration profile that increases along a direction extending from the epitaxial material to the base substrate. In some embodiments, the doped epitaxial layer has a width that is less than approximately 100 nm. In some embodiments, the doped epitaxial layer has a first height directly below the epitaxial material, the first height being less than approximately 10% of a second height of the epitaxial material. In some embodiments, the method further includes performing an implantation process between etching the base substrate to define the recess and forming the doped epitaxial layer, the implantation process implanting a dopant species along the one or more interior surfaces of the base substrate.

In other embodiments, the present disclosure relates to a method of forming an integrated chip structure. The method includes etching a base substrate having a first semiconductor material to form a recess defined by one or more interior surfaces of the base substrate; performing a first deposition process to form a doped epitaxial layer along the one or more interior surfaces of the base substrate; performing a second deposition process to form an epitaxial material having a second semiconductor material onto the doped epitaxial layer, the epitaxial material having a maximum dopant concentration that is less than the doped epitaxial layer; performing a first implantation process to form a first doped photodiode region within the epitaxial material; and performing a second implantation process to form a second doped photodiode region within the epitaxial material, wherein the second doped photodiode region laterally surrounds the first doped photodiode region. In some embodiments, the first deposition process is performed by introducing a dopant into a process chamber while epitaxially growing a semiconductor material onto the one or more interior surfaces of the base substrate. In some embodiments, the first deposition process forms the doped epitaxial layer to be a same material as the base substrate. In some embodiments, the method further includes performing an additional deposition process to form an additional doped epitaxial layer along sidewalls of the doped epitaxial layer, wherein the additional doped epitaxial layer is a different material than the doped epitaxial layer. In some embodiments, the first deposition process forms the doped epitaxial layer to be a different material than the base substrate. In some embodiments, the doped epitaxial layer is laterally separated from the second doped photodiode region by a non-zero distance. In some embodiments, the doped epitaxial layer has an uppermost surface that is vertically above an uppermost surface of the base substrate. In some embodiments, the method further includes forming a cap layer onto uppermost surfaces of the epitaxial material and the doped epitaxial layer.

In yet other embodiments, the present disclosure relates to an integrated chip structure. The integrated chip structure includes a base substrate having one or more interior surfaces defining a recess within an upper surface of the base substrate; an epitaxial material disposed within the recess; a first doped photodiode region disposed within the epitaxial material and having a first doping type; a second doped photodiode region disposed within the epitaxial material and having a second doping type, wherein the second doped photodiode region laterally surrounds the first doped photodiode region; and a doped epitaxial layer disposed horizontally and vertically between the base substrate and the epitaxial material, the doped epitaxial layer having the second doping type. In some embodiments, the doped epitaxial layer is a same material as the epitaxial material. In some embodiments, the doped epitaxial layer is a same material as the base substrate. In some embodiments, the doped epitaxial layer is both vertically and laterally separated from the second doped photodiode region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip structure, comprising:
   etching a base substrate of a first semiconductor material to form a recess defined by one or more interior surfaces of the base substrate;
   forming a doped epitaxial layer along the one or more interior surfaces of the base substrate;
   forming an epitaxial material on horizontally and vertically extending surfaces of the doped epitaxial layer, wherein the epitaxial material is a second semiconductor material and the doped epitaxial layer consists of the second semiconductor material and a dopant, the second semiconductor material being different than the first semiconductor material;
   forming a first doped photodiode region within the epitaxial material, the first doped photodiode region comprising a first doping type;
   forming a second doped photodiode region within the epitaxial material, the second doped photodiode region comprising a second doping type; and
   wherein the base substrate has an upper surface physically contacting a bottommost surface of the doped epitaxial layer, the upper surface of the base substrate having a lower dopant concentration than the bottommost surface of the doped epitaxial layer.

2. The method of claim 1, further comprising:
   forming a cap layer over the epitaxial material, wherein the first doping type of the first doped photodiode region and the second doping type of the second doped photodiode region are both formed to extend from within the epitaxial material to within the cap layer.

3. The method of claim 2, wherein the doped epitaxial layer consists of germanium and a p-type dopant.

4. The method of claim 1, wherein the second doped photodiode region laterally surrounds the first doped photodiode region, wherein a topmost surface of the epitaxial material laterally extends for non-zero distances between outermost edges of the first doped photodiode region and interior edges of the second doped photodiode region facing the first doped photodiode region.

5. The method of claim 1, wherein a doping concentration within the epitaxial material changes by an order of magnitude over a distance that is less than or equal to approximately 1000 Angstroms.

6. The method of claim 1, wherein dopants are introduced into the doped epitaxial layer during formation of the doped epitaxial layer along the one or more interior surfaces of the base substrate.

7. The method of claim 1, wherein the doped epitaxial layer has a first height directly below the epitaxial material, the first height being less than approximately 10% of a second height of the epitaxial material.

8. The method of claim 1, further comprising:
performing an implantation process between etching the base substrate to define the recess and forming the doped epitaxial layer, wherein the implantation process implants a dopant species into the base substrate to form an additional doped region along sidewalls and the upper surface of the base substrate that forms the recess, the additional doped region being laterally separated from a closest isolation structure disposed within an uppermost surface of the base substrate.

9. A method of forming an integrated chip structure, comprising:
etching a base substrate comprising a first semiconductor material to form a recess defined by sidewalls and an upper surface of the base substrate;
forming an additional doped region along the sidewalls and the upper surface of the base substrate, the additional doped region being vertically and laterally surrounded along opposing sides by the base substrate;
performing a first deposition process to form a doped epitaxial layer along the one or more interior surfaces of the base substrate, the doped epitaxial layer and the additional doped region having a same dopant, wherein the doped epitaxial layer is laterally and vertically separated from the additional doped region by a region of the base substrate having a lower concentration of the dopant than the doped epitaxial layer and the additional doped region;
performing a second deposition process to form an epitaxial material comprising a second semiconductor material onto the doped epitaxial layer, the epitaxial material having a maximum dopant concentration that is less than a dopant concentration of the doped epitaxial layer;
performing a first implantation process to form a first doped photodiode region within the epitaxial material; and
performing a second implantation process to form a second doped photodiode region within the epitaxial material, wherein the second doped photodiode region laterally surrounds the first doped photodiode region.

10. The method of claim 9, wherein the region of the base substrate has a varying dopant concentration with a minimum that is non-zero distances from a top and a bottom of the region, and the additional doped region has a varying dopant concentration with a maximum that is non-zero distances from a top and a bottom of the additional doped region.

11. The method of claim 9, wherein the additional doped region is formed by implanting dopants into the base substrate prior to performing the first deposition process.

12. The method of claim 11, further comprising:
performing an additional deposition process to form an additional doped epitaxial layer along sidewalls of the doped epitaxial layer, wherein the additional doped epitaxial layer is a different material than the doped epitaxial layer.

13. The method of claim 9, wherein the additional doped region has a horizontally extending segment, a first vertically extending segment protruding outward from an upper boundary of the horizontally extending segment along a first side of the epitaxial material, and a second vertically extending segment protruding outward from the upper boundary of the horizontally extending segment along a second side of the epitaxial material, the base substrate arranged along opposing sides of the first vertically extending segment, along opposing sides of the second vertically extending segment, and above and below the horizontally extending segment.

14. The method of claim 9,
wherein the region of the base substrate has a first variable dopant concentration that has a minimum value at a first position separated from the doped epitaxial layer and the additional doped region by non-zero distances; and
wherein the additional doped region has a second variable dopant concentration that has a maximum value at a second position separated from opposing edges of the additional doped region by non-zero distances.

15. The method of claim 9, wherein both the epitaxial material and the doped epitaxial layer have uppermost surfaces that are vertically above an uppermost surface of the base substrate.

16. The method of claim 9, further comprising:
forming a cap layer onto an uppermost surface of the epitaxial material, the cap layer having opposing outermost sidewalls laterally confined between outermost sidewalls of the doped epitaxial layer, wherein the opposing outermost sidewalls of the cap layer vertically straddle an uppermost surface of the base substrate and an uppermost surface of the doped epitaxial layer.

17. A method of forming an integrated chip structure, comprising:
forming a recess within a silicon substrate;
forming an in-situ doped epitaxial germanium within the recess and physically contacting the silicon substrate, the in-situ doped epitaxial germanium comprising a first concentration of a first dopant species that is between approximately 5e17 atoms/cm$^3$ and approximately 1e20 atoms/cm$^3$;
forming a germanium epitaxial material to physically contact the in-situ doped epitaxial germanium and within the recess, wherein a part of the germanium epitaxial material has a gradient doping concentration of the first dopant species, the gradient doping concentration comprising a second concentration that is less than the first concentration;
forming a first doped photodiode region within the germanium epitaxial material, the first doped photodiode region comprising a first doping type;
forming a second doped photodiode region within the germanium epitaxial material, the second doped photodiode region comprising a second doping type; and
wherein the gradient doping concentration within the germanium epitaxial material decreases from a bottommost surface of the germanium epitaxial material to a minimum dopant concentration that is non-zero distance over the bottommost surface.

18. The method of claim 17, wherein the in-situ doped epitaxial germanium has a stepped doping concentration with a plurality of discrete doping concentrations separated from one another.

19. The method of claim 17, wherein the silicon substrate comprises a first region that continuously extends between a bottommost surface of the in-situ doped epitaxial germanium and a top of a second region of the silicon substrate, the first region having a first dopant concentration that is a convex function, the second region having a second dopant concentration that is a concave function, and the first dopant concentration being smaller than both a dopant concentration of the in-situ doped epitaxial germanium and the second dopant concentration.

20. The method of claim 17, wherein the gradient doping concentration changes by over an order of magnitude over a distance that is less than or equal to approximately 1000 Angstroms.

* * * * *